(12) United States Patent
Takashima et al.

(10) Patent No.: US 12,509,320 B2
(45) Date of Patent: *Dec. 30, 2025

(54) THREADLIKE ADHESIVE STICKING APPARATUS AND METHOD FOR STICKING THREADLIKE ADHESIVE

(71) Applicant: NITTO DENKO CORPORATION, Ibaraki (JP)

(72) Inventors: Atsushi Takashima, Ibaraki (JP); Tomohiro Taruno, Ibaraki (JP); Hiromitsu Morishita, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 391 days.

This patent is subject to a terminal disclaimer.

(21) Appl. No.: 17/914,743

(22) PCT Filed: Mar. 26, 2021

(86) PCT No.: PCT/JP2021/013145
§ 371 (c)(1),
(2) Date: Sep. 26, 2022

(87) PCT Pub. No.: WO2021/200761
PCT Pub. Date: Oct. 7, 2021

(65) Prior Publication Data
US 2023/0183033 A1 Jun. 15, 2023

(30) Foreign Application Priority Data
Mar. 31, 2020 (JP) .................... 2020-064049

(51) Int. Cl.
*B65H 37/02* (2006.01)
*B65H 51/00* (2006.01)
(Continued)

(52) U.S. Cl.
CPC ............. *B65H 37/02* (2013.01); *B65H 51/00* (2013.01); *B65H 57/12* (2013.01); *C09J 7/21* (2018.01);
(Continued)

(58) Field of Classification Search
CPC ........ H05K 13/06; G02B 6/46; B29C 70/384; B29C 64/209; B65H 37/02; B65H 51/00;
(Continued)

(56) References Cited

U.S. PATENT DOCUMENTS

2004/0074086 A1* 4/2004 Yamaguchi ........... H01F 41/074
29/745
2008/0143534 A1* 6/2008 Lolli ..................... H05K 13/06
340/572.7
(Continued)

FOREIGN PATENT DOCUMENTS

| CN | 101460256 A | 6/2009 |
| CN | 203072311 U | 7/2013 |

(Continued)

OTHER PUBLICATIONS

International Search Report issued for corresponding International Patent Application No. PCT/JP2021/013145 on Jun. 8, 2021, along with an English translation (5 pages).
(Continued)

*Primary Examiner* — John L Goff, II
(74) *Attorney, Agent, or Firm* — Hauptman Ham, LLP

(57) ABSTRACT

A threadlike adhesive sticking apparatus of the present invention includes, a nozzle comprising a pressing unit configured to press a threadlike adhesive against an object, a nozzle displacement unit that is attached to the nozzle and is configured to displace the nozzle by being displaced in a pressing direction, and an absorption mechanism configured to absorb a displacement of the nozzle with respect to a (Continued)

displacement of the nozzle displacement unit in the pressing direction.

12 Claims, 25 Drawing Sheets

(51) Int. Cl.
*B65H 57/12* (2006.01)
*C09J 7/21* (2018.01)
*C09J 133/08* (2006.01)

(52) U.S. Cl.
CPC .......... *C09J 133/08* (2013.01); *B65H 2701/30* (2013.01); *C09J 2400/263* (2013.01); *C09J 2433/00* (2013.01)

(58) Field of Classification Search
CPC .... B65H 57/12; B65H 57/26; B65H 2701/30; B65H 35/0033; B65H 35/0073; B65H 2403/60; C09J 7/21; C09J 133/08; C09J 2400/263; C09J 2433/00; B65B 51/06; Y10T 156/1788; Y10T 156/1795
USPC ..................................... 29/745; 156/574, 577
See application file for complete search history.

(56) References Cited

U.S. PATENT DOCUMENTS

| | | | |
|---|---|---|---|
| 2011/0030202 A1* | 2/2011 | Tani | ................. H05K 13/06 29/739 |
| 2012/0279664 A1 | 11/2012 | Sakamoto | |
| 2014/0291886 A1* | 10/2014 | Mark | ..................... B33Y 10/00 264/259 |
| 2017/0326802 A1 | 11/2017 | Mark et al. | |
| 2018/0126639 A1* | 5/2018 | Tyler | ..................... B29C 64/336 |
| 2019/0259531 A1 | 8/2019 | Okudaria et al. | |
| 2022/0165492 A1 | 5/2022 | Okudaria et al. | |
| 2024/0321514 A1 | 9/2024 | Okudaria et al. | |

FOREIGN PATENT DOCUMENTS

| | | | | |
|---|---|---|---|---|
| CN | 104191809 | A | 12/2014 | |
| CN | 206373022 | U | 8/2017 | |
| CN | 207163610 | U | 3/2018 | |
| CN | 112178021 | A | 1/2021 | |
| CN | 113783378 | A | 12/2021 | |
| JP | S47-11910 | U | 10/1972 | |
| JP | S52-105096 | A | 9/1977 | |
| JP | H3-119083 | A | 5/1991 | |
| JP | 2004-58003 | A | 2/2004 | |
| JP | 2008-235685 | A | 10/2008 | |
| JP | 4793608 | B2 | 10/2011 | |
| WO | WO-2018166827 | A1 * | 9/2018 | ........... B29C 64/118 |

OTHER PUBLICATIONS

Written Opinion issued for corresponding International Patent Application No. PCT/JP2021/013145 on Jun. 8, 2021 (3 pages).

Office Action issued on Jun. 3, 2025 for corresponding Chinese Patent Application No. 202180024294.X, along with English machine translation (18 pages).

* cited by examiner (a)  (b)

(a)

(b)

THREADLIKE ADHESIVE STICKING APPARATUS AND METHOD FOR STICKING THREADLIKE ADHESIVE

CROSS REFERENCE TO RELATED APPLICATION

This application is a National Stage of International Application No. PCT/JP2021/013145, filed on Mar. 26, 2021, which designates the United States and was published in Japan, and which is based upon and claims priority to Japanese Patent Application No. 2020-064049, filed on Mar. 31, 2020 in the Japan Patent Office. All of the aforementioned applications are hereby incorporated by reference in their entireties.

TECHNICAL FIELD

The present invention relates to a threadlike adhesive sticking apparatus and a method for sticking a threadlike adhesive.

BACKGROUND ART

An adhesive body such as an adhesive sheet and an adhesive tape is used for bonding of various adherends such as metal, glass, wood, paper, cardboard, and plastic material. For example, for a wound form such as a roll-shaped adhesive tape, a base material having a rear surface subjected to a debonding treatment, which is brought into contact with an adhesive surface, is used to facilitate rewinding.

One of adhesive tape sticking apparatuses is an adhesive tape holder in which an adhesive tape pulled out from a tip end of a holder for storing a roll-shaped adhesive tape is pressed against an adherend by a peripheral wall surrounding a hole at the tip end of the holder (see Patent Literature 1). The adhesive tape holder is moved while the tip end of the holder is brought into contact with an adherend, thereby pulling out and sticking the adhesive tape to the adherend.

CITATION LIST

Patent Literature

Patent Literature 1: JP H3-119083 A

SUMMARY OF INVENTION

Technical Problem

In Patent Literature 1, the adhesive tape can be stuck by bringing the tip end of the adhesive tape holder into contact with the object and moving the tip end as if drawing a line. If a threadlike adhesive obtained by applying an adhesive to a threadlike core material is used instead of the adhesive tape, it is necessary to press the tip end of the adhesive tape holder against the object to such an extent that the threadlike adhesive is moderately deformed. This is because: the threadlike adhesive exhibits an adhesive force by being pressed to an object and deformed; the threadlike adhesive is different from an adhesive tape, which is capable of being stuck with a light pressing force of about its own weight if the tape has an extra length in the initial stage of sticking; the threadlike adhesive is not stuck when the pressing force is too weak; and the threadlike adhesive is largely deformed when the pressing force is too strong. When the pressing force is too strong, problems such as sticking out of the adhesive (lowering of adhesion width accuracy) or unevenness of the height of the threadlike adhesive occur.

In Patent Literature 1, it is not considered that the adhesive tape is stuck by pressing, and further, it is not considered that the adhesive tape is stuck by changing the pressing force. Thus, if the threadlike adhesive is tried to be stuck with the adhesive tape holder of Patent Literature 1, the pressing force may be excessively increased. The excessive increase in the pressing force is likely to occur when a height of an adhesive surface of the object changes depending on the accuracy or when the adhesive surface of the object has unevenness, and the excessive increase may cause the adhesive to be largely deformed to cause the above-described problem.

The present invention has been made in view of the above-described circumstances, and an object of the present invention is to provide a threadlike adhesive sticking apparatus and a method for sticking a threadlike adhesive. The threadlike adhesive sticking apparatus and the method for sticking a threadlike adhesive allows a threadlike adhesive to appropriately exhibit an adhesive force to be accurately stuck to any path.

Solution to Problem

A threadlike adhesive sticking apparatus of the present invention includes, a nozzle comprising a pressing unit configured to press a threadlike adhesive against an object; a nozzle displacement unit that is attached to the nozzle and is configured to displace the nozzle by being displaced in a pressing direction; and an absorption mechanism configured to absorb a displacement of the nozzle with respect to a displacement of the nozzle displacement unit in the pressing direction.

In the threadlike adhesive sticking apparatus of the present invention, for example, the absorption mechanism is any one of a spring, a damper, and an air cylinder attached between the nozzle displacement unit and the nozzle.

The threadlike adhesive sticking apparatus of the present invention includes, for example, a movement control unit configured to control movement of the nozzle displacement unit so as to stick the threadlike adhesive to the object along a predetermined path. The movement control unit is configured to cause the nozzle displacement unit to approach the object, at least at any one of a start point of the predetermined path, a start point or an end point of a curve included in the predetermined path, and a vertex of a corner included in the predetermined path.

In the threadlike adhesive sticking apparatus of the present invention, for example, the nozzle includes an inner wall surface defining a cylindrical internal space and includes a tip end having a tip end opening allowing the internal space to communicate with the outside at one end of the inner wall surface. The pressing unit is configured to press the threadlike adhesive allowed to pass through the internal space and is led out to the outside from the tip end opening, against the object. Portions of a peripheral portion surrounding the tip end opening at the tip end function as the pressing unit.

The threadlike adhesive sticking apparatus of the present invention is, for example, configured to feed out and press the threadlike adhesive wound around a winding body against the object. The apparatus further includes an assist mechanism configured to apply an external force in a feeding direction to the threadlike adhesive fed out from the winding body, and the pressing unit is configured to press the fed out threadlike adhesive against the object.

A method for sticking a threadlike adhesive of the present invention includes sticking the threadlike adhesive to the object by using the threadlike adhesive sticking apparatus of the present invention.

Advantageous Effects of Invention

The present invention allows the threadlike adhesive to appropriately exhibit the adhesive force to be accurately stuck to any path.

Figure 10:
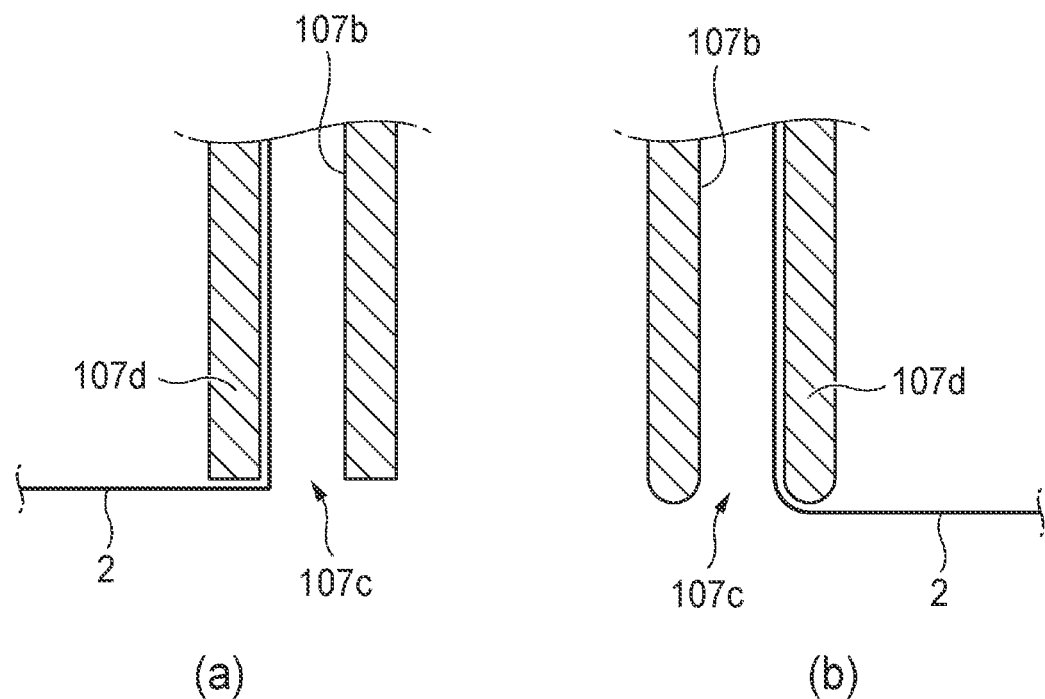

The parts (a) and (b) of FIG. 10 are enlarged cross-sectional views of a nozzle tip end.

Figure 11:
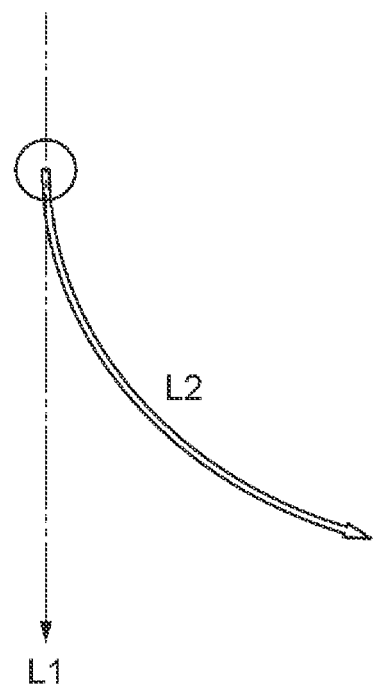

FIG. 11 is a conceptual diagram illustrating a configuration in which the nozzle of the threadlike adhesive sticking apparatus is moved.

Figure 12:
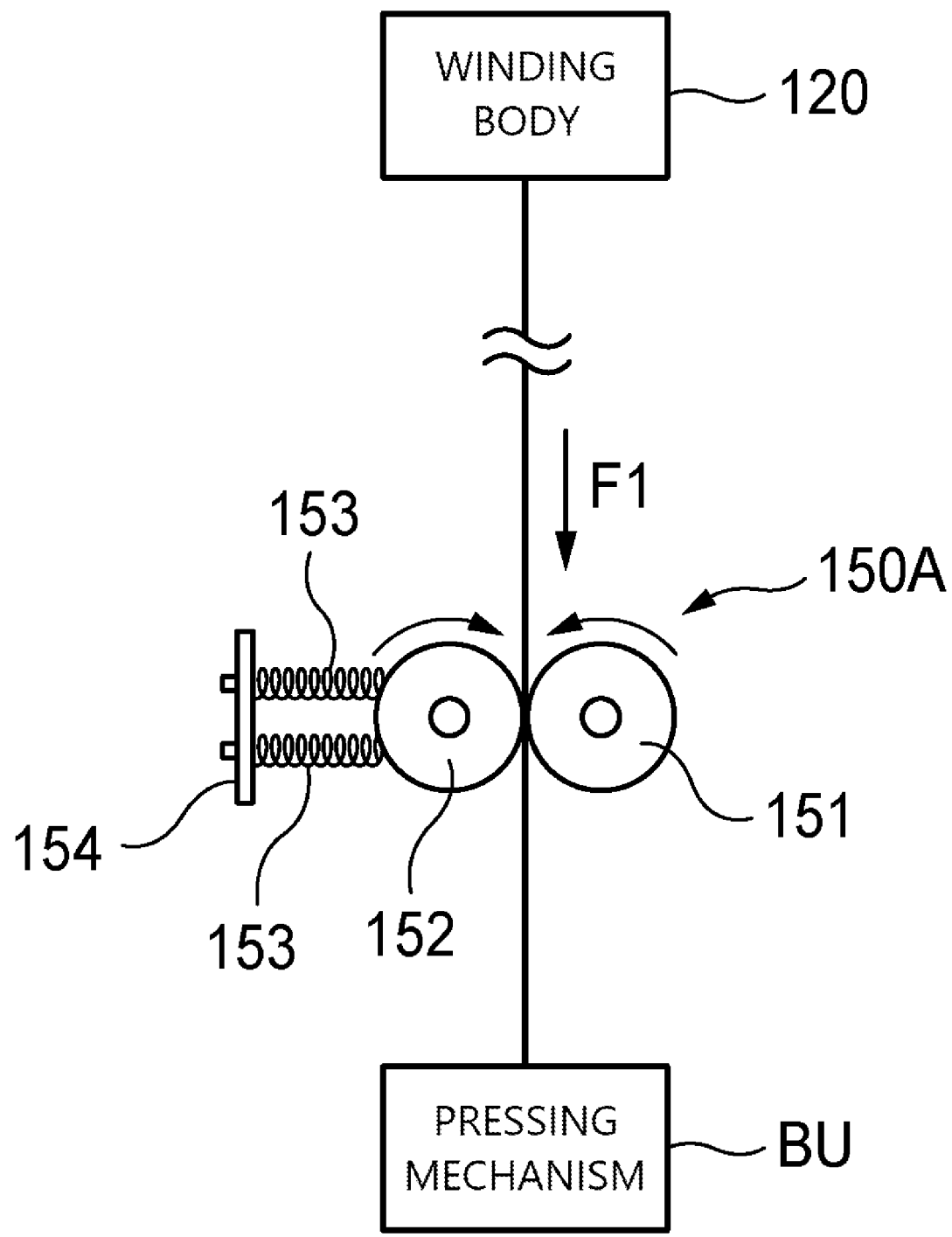

FIG. 12 is a view illustrating a first example of a feeding-out assist mechanism.

Figure 13:
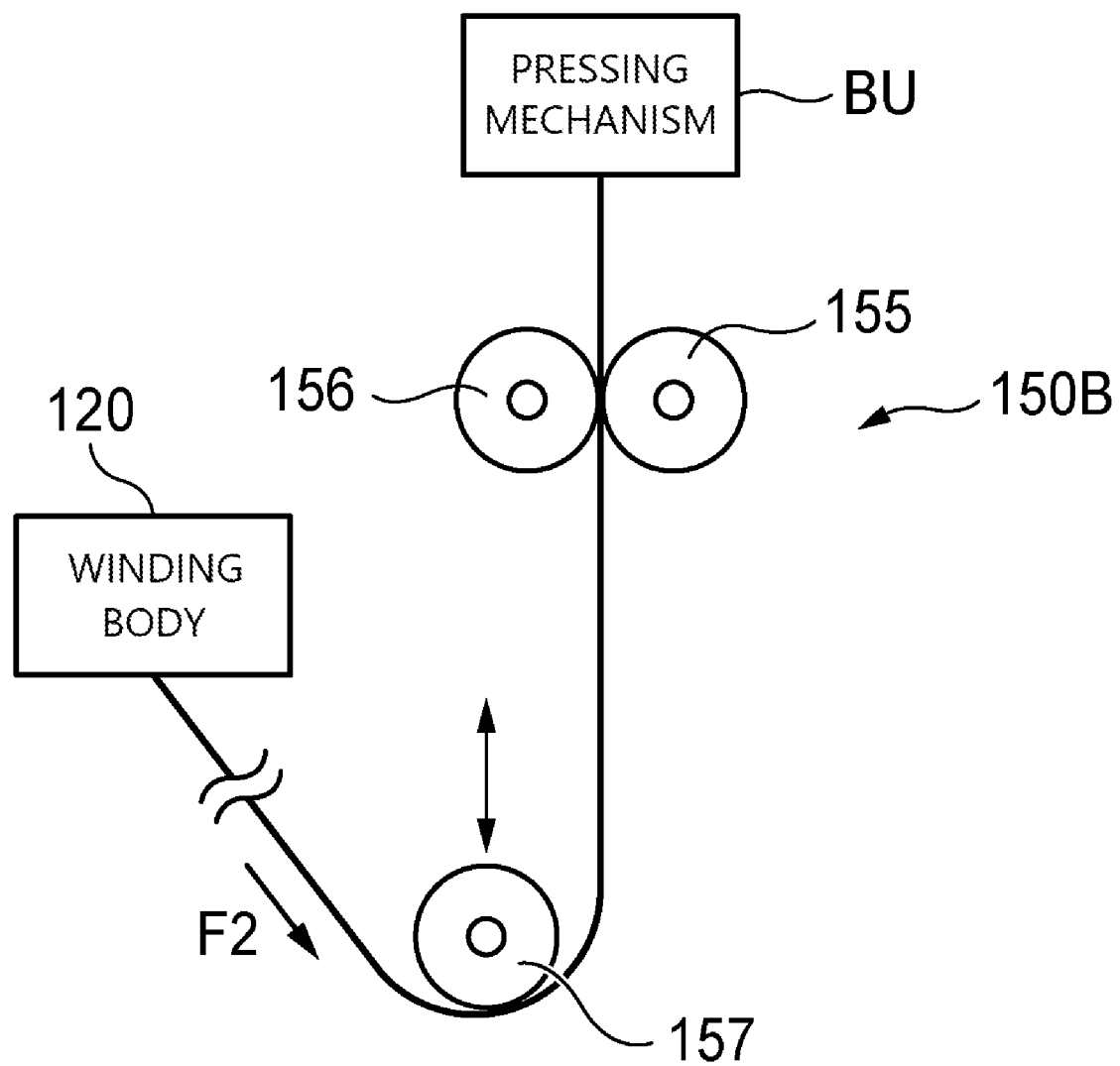

FIG. 13 is a view illustrating a second example of the feeding-out assist mechanism.

Figure 14:
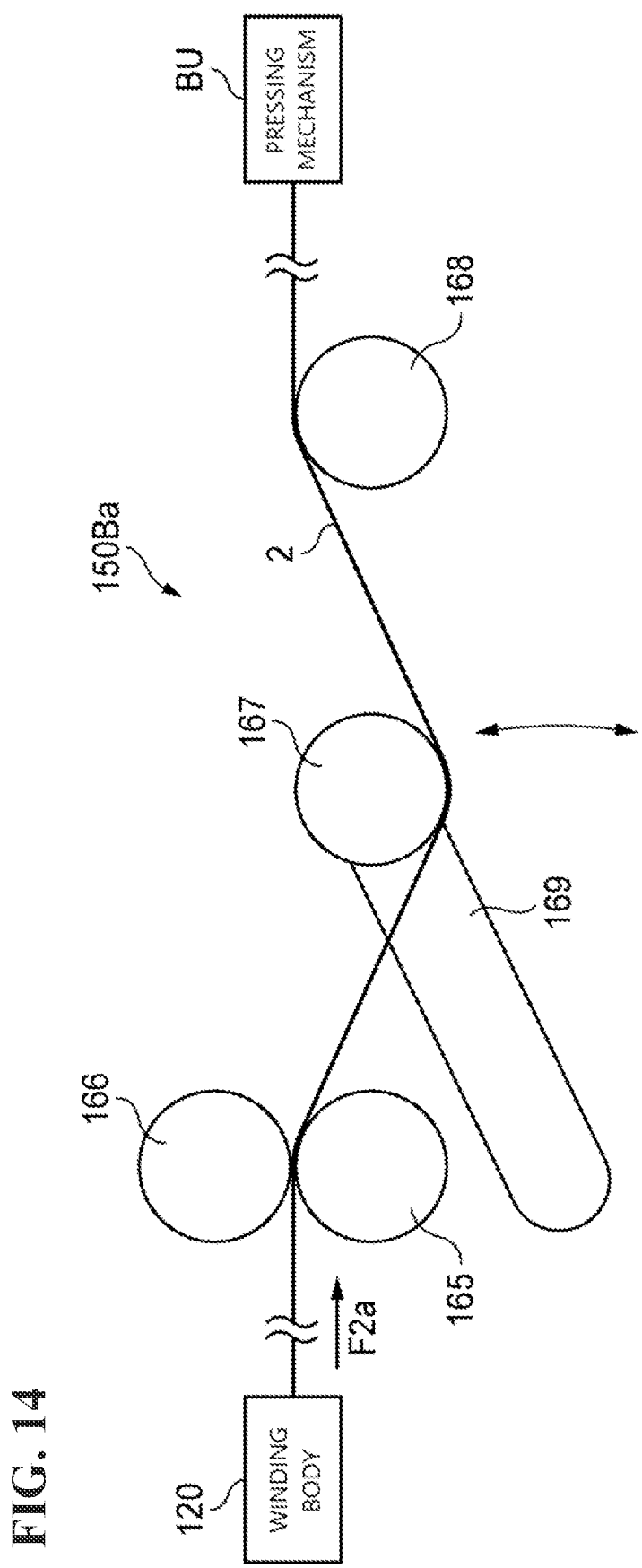

FIG. 14 is a view illustrating a third example of the feeding-out assist mechanism.

Figure 15:
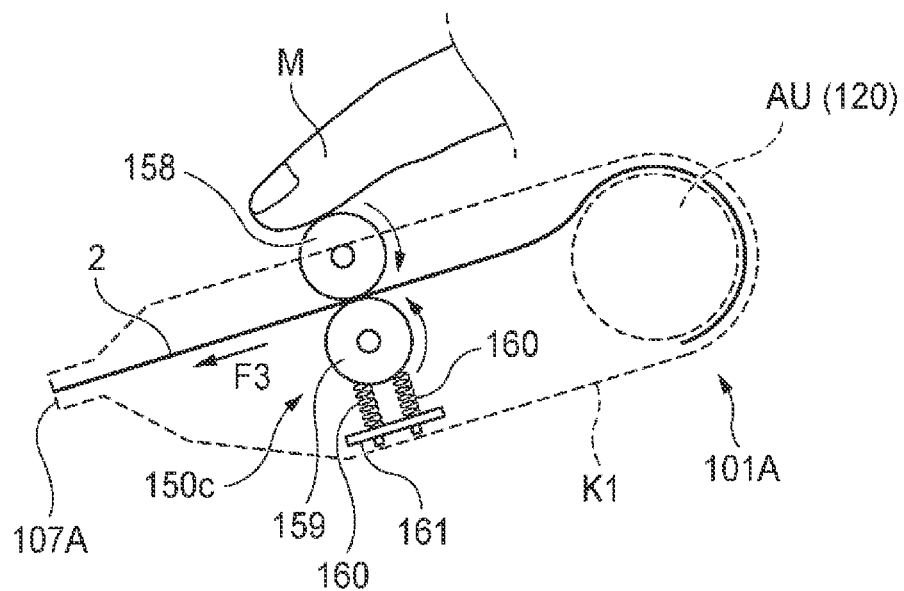

FIG. 15 is a view illustrating a fourth example of the feeding-out assist mechanism.

Figure 16:
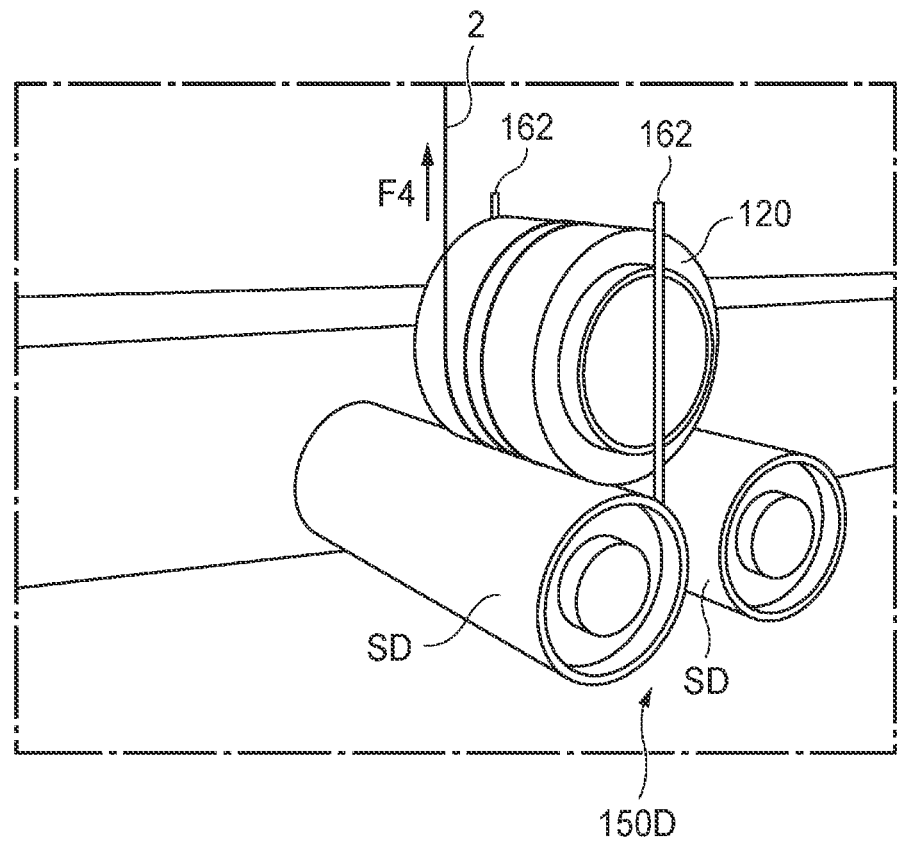

FIG. 16 is a view illustrating a fifth example of the feeding-out assist mechanism.

Figure 17:
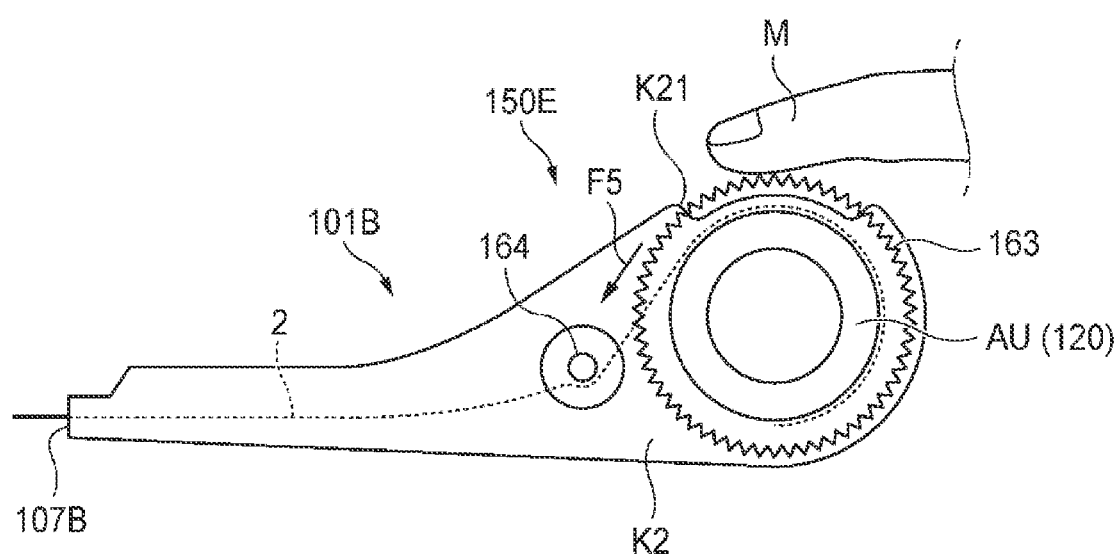

FIG. 17 is a view illustrating a sixth example of the feeding-out assist mechanism.

Figure 18:
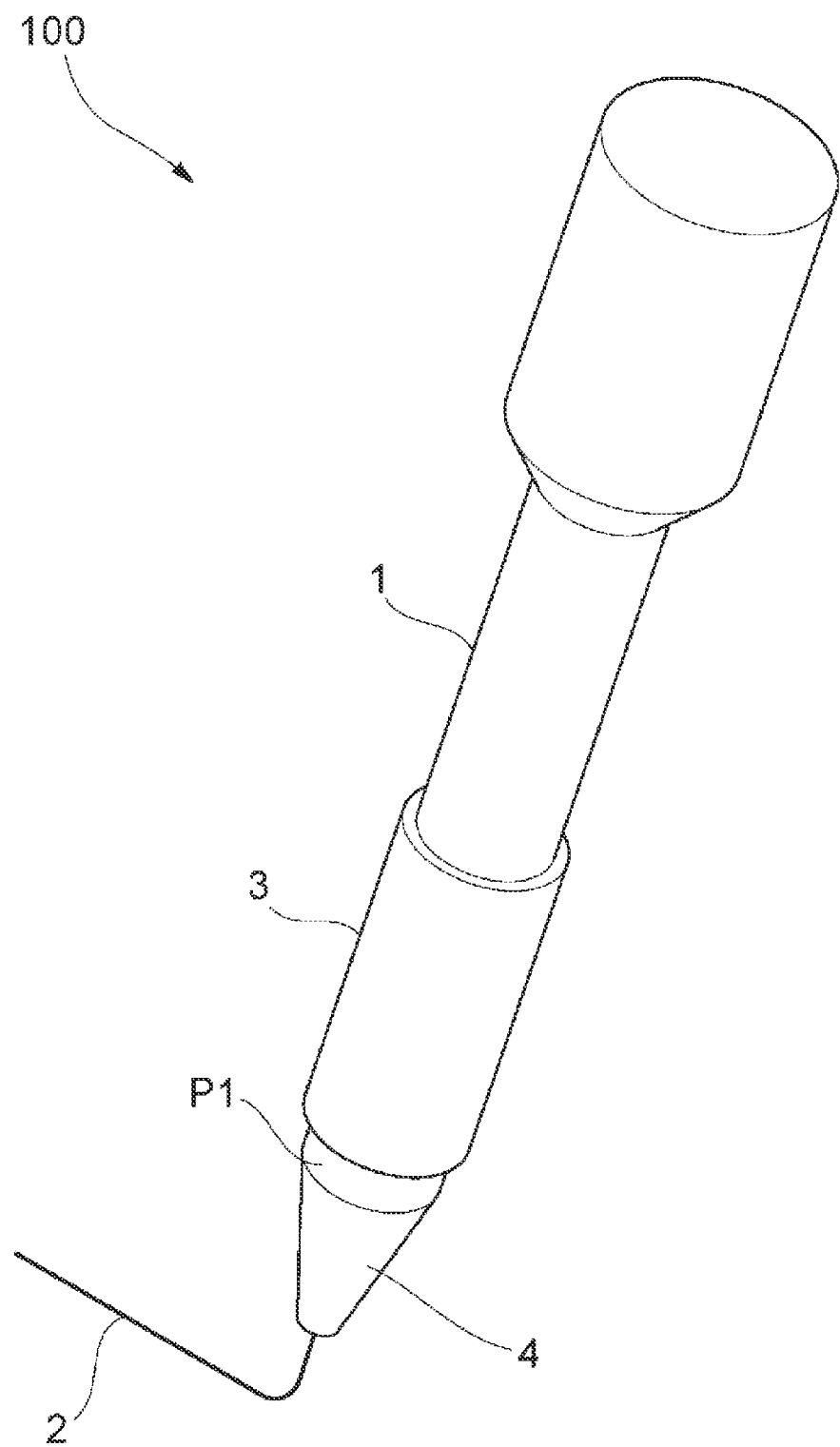

FIG. 18 is a perspective view illustrating a threadlike adhesive sticking apparatus according to a second embodiment of the present invention.

Figure 19:
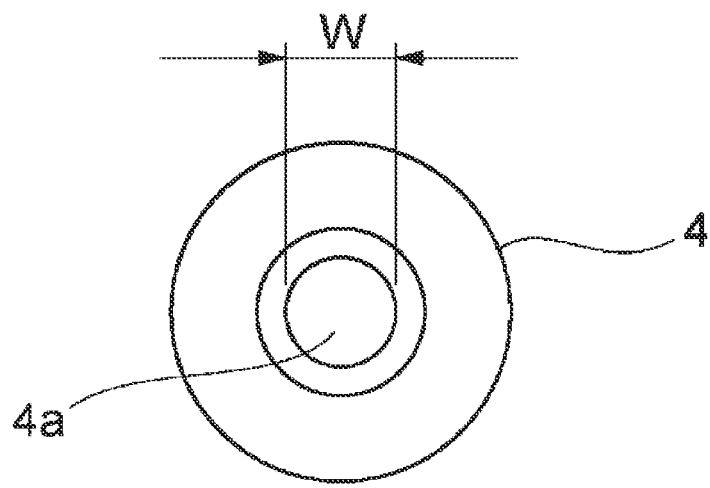
Figure 19:
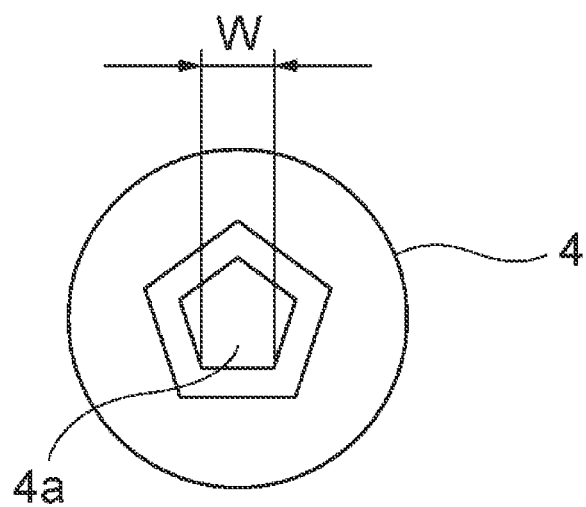

The parts (a) and (b) of FIG. 19 are views illustrating an example of a cross-sectional shape of a tip end portion viewed from a tip end opening side. The part (a) of FIG. 19 is a view illustrating a tip end portion having a circular cross-section, and the part (b) of FIG. 19 is a view illustrating a tip end portion having a rectangular cross-section.

Figure 20:
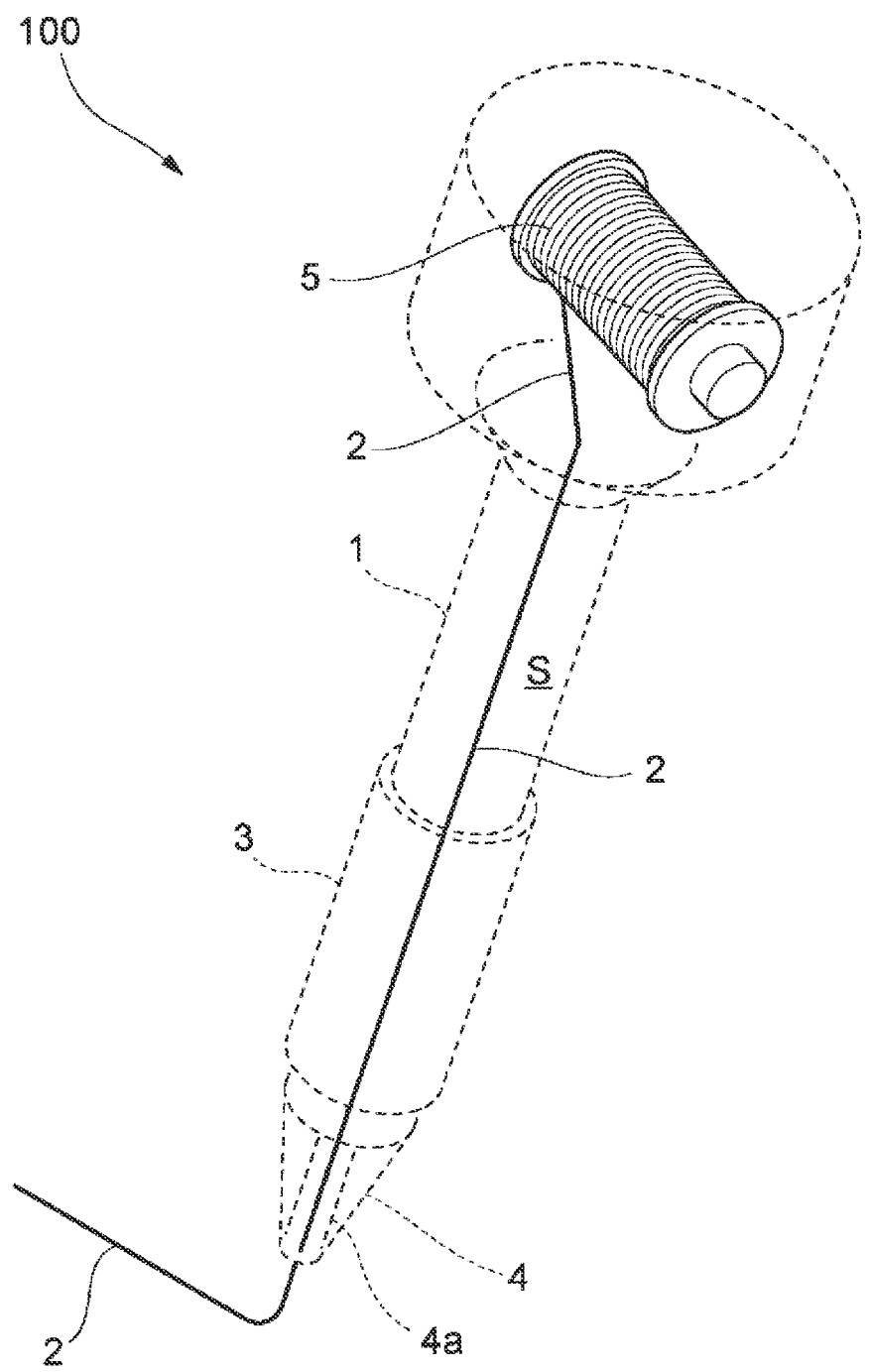

FIG. 20 is a perspective view illustrating an internal structure of a threadlike adhesive sticking apparatus according to a third embodiment.

Figure 21:
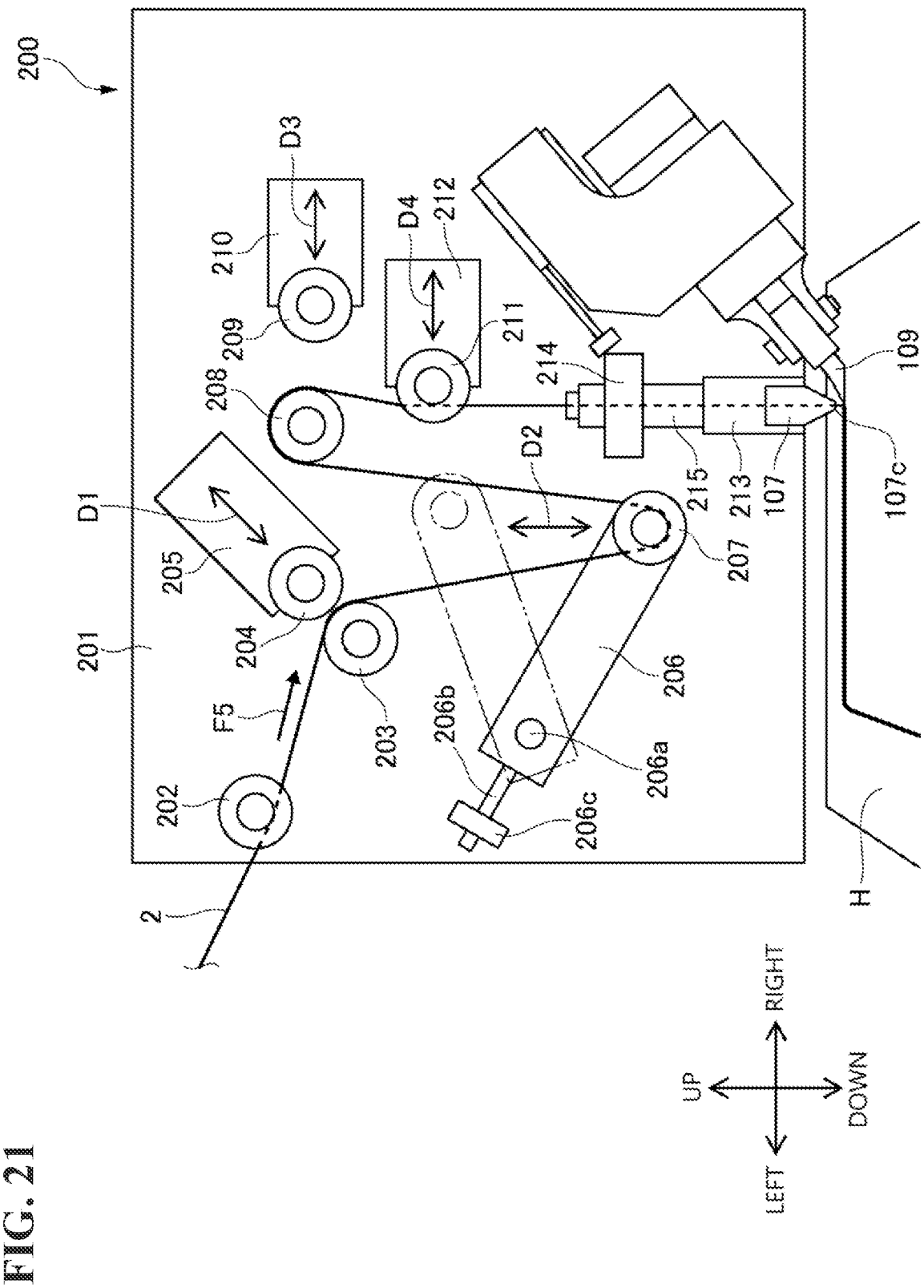

FIG. 21 is a schematic front view illustrating a main part of a threadlike adhesive sticking apparatus according to a fourth embodiment.

Figure 22:
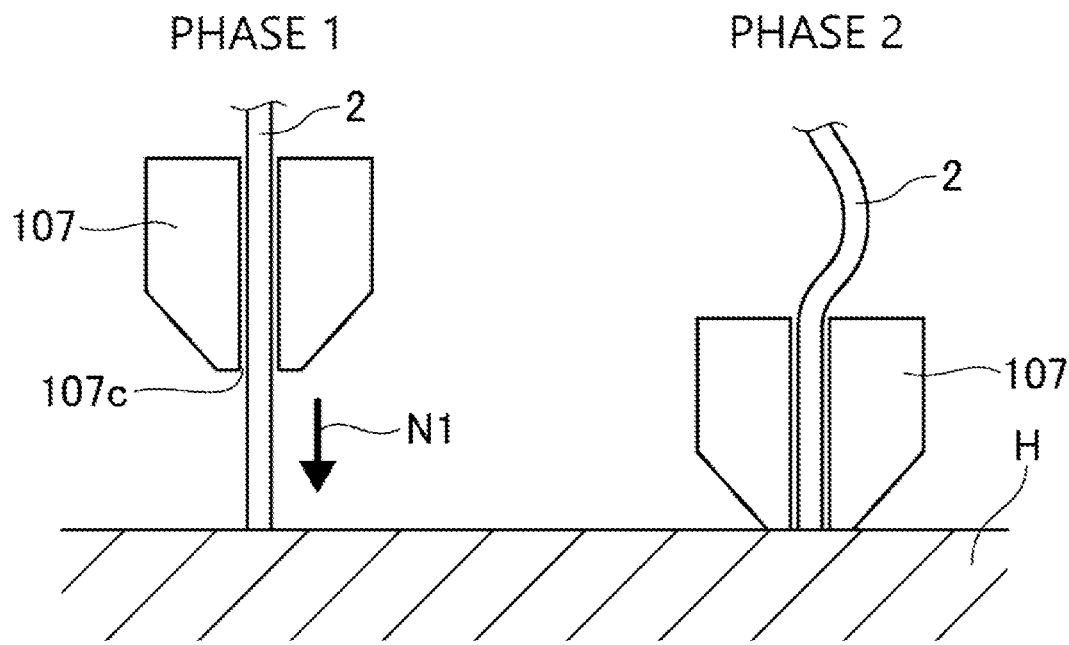

FIG. 22 is a diagram illustrating a problem of sticking start point creation when an extra length of a threadlike adhesive is short.

Figure 23:
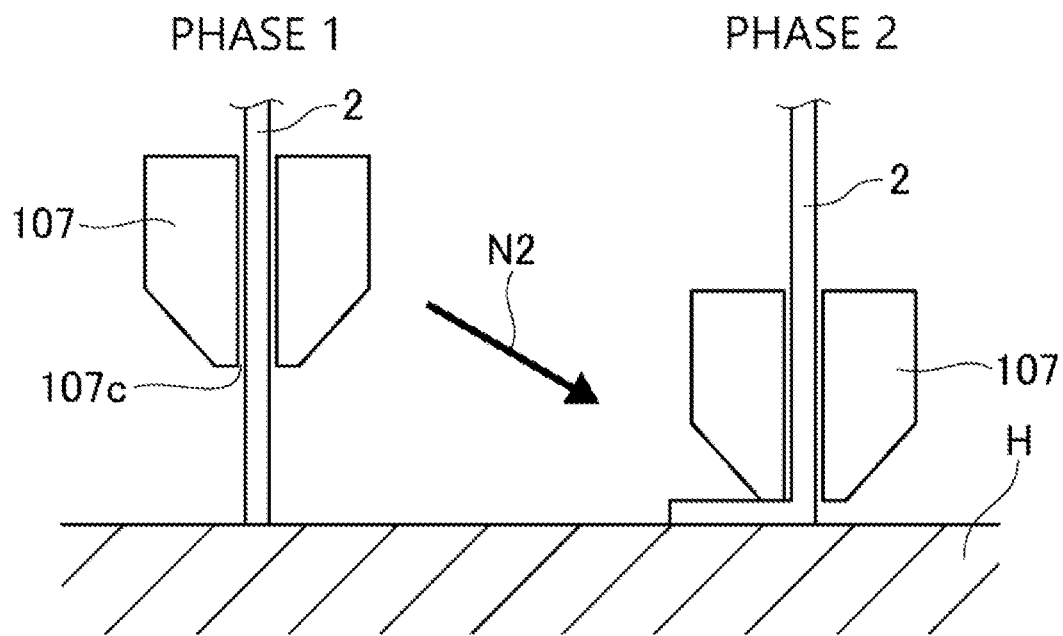

FIG. 23 is a diagram illustrating a movement of a nozzle in the sticking start point creation when the extra length of a threadlike adhesive is short.

Figure 24:
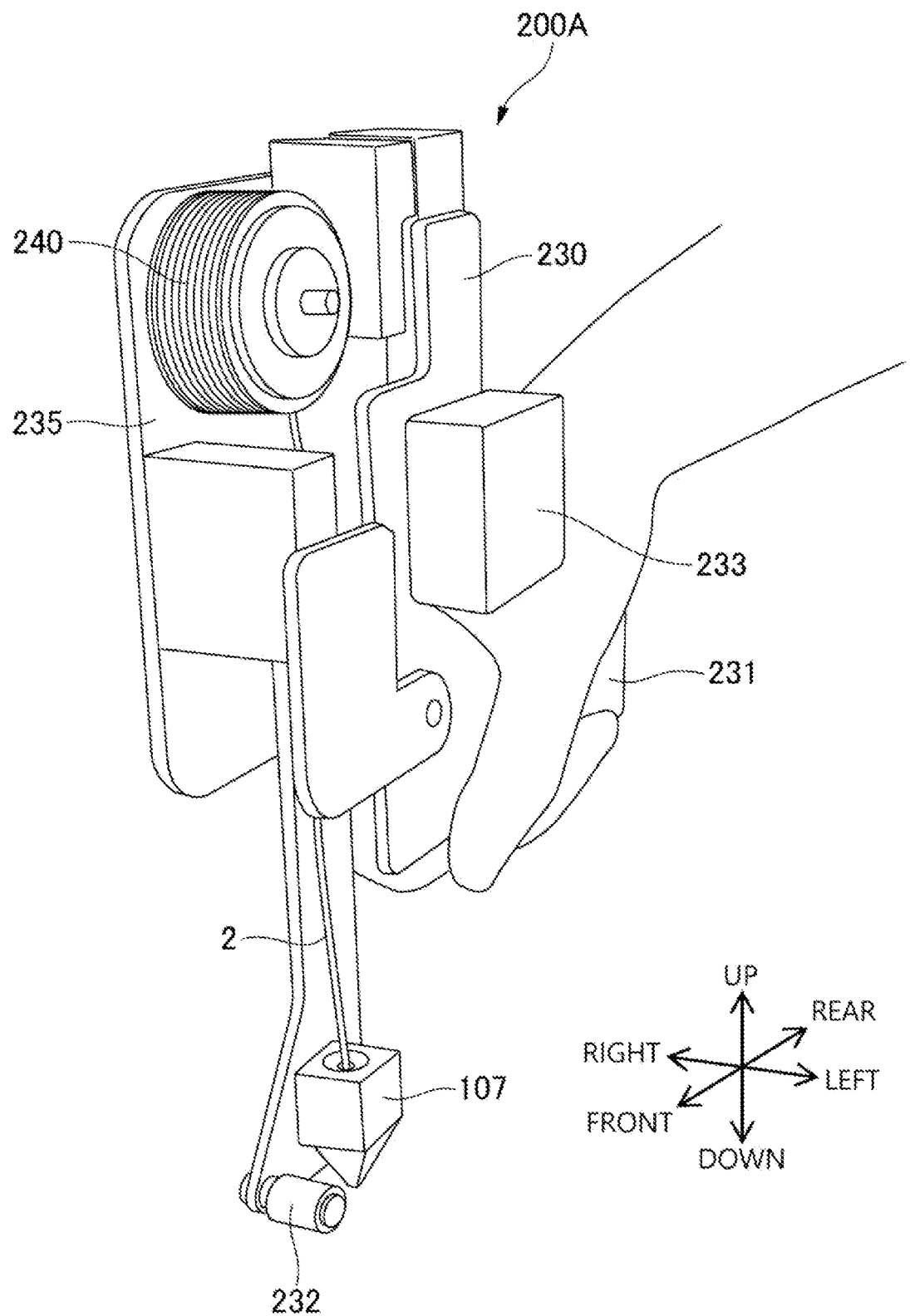

FIG. 24 is a perspective view illustrating a threadlike adhesive sticking apparatus according to a fifth embodiment.

Figure 25:
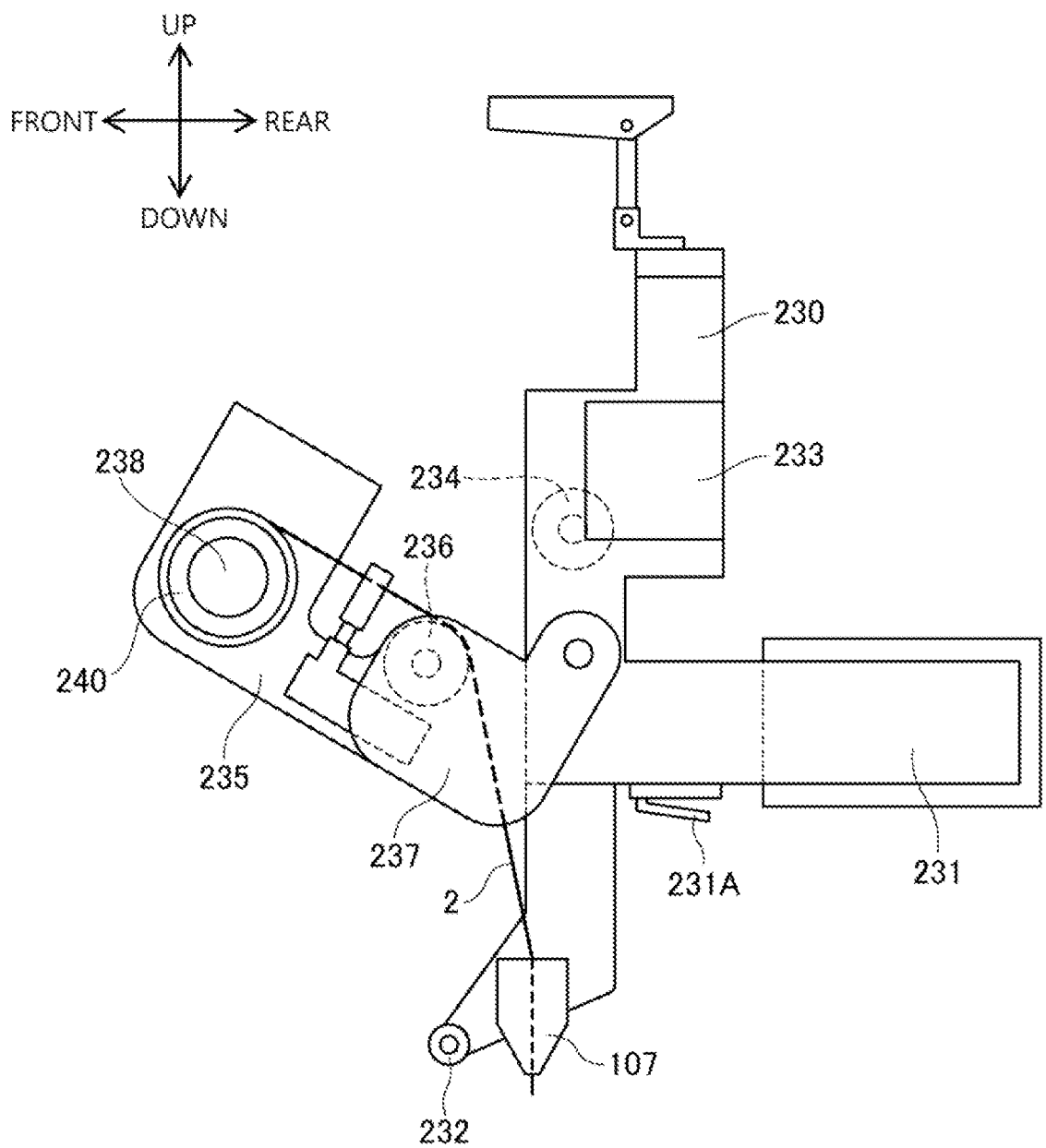

FIG. 25 is a front view illustrating a state where an opening/closing frame is opened in the threadlike adhesive sticking apparatus according to the fifth embodiment.

Figure 26:
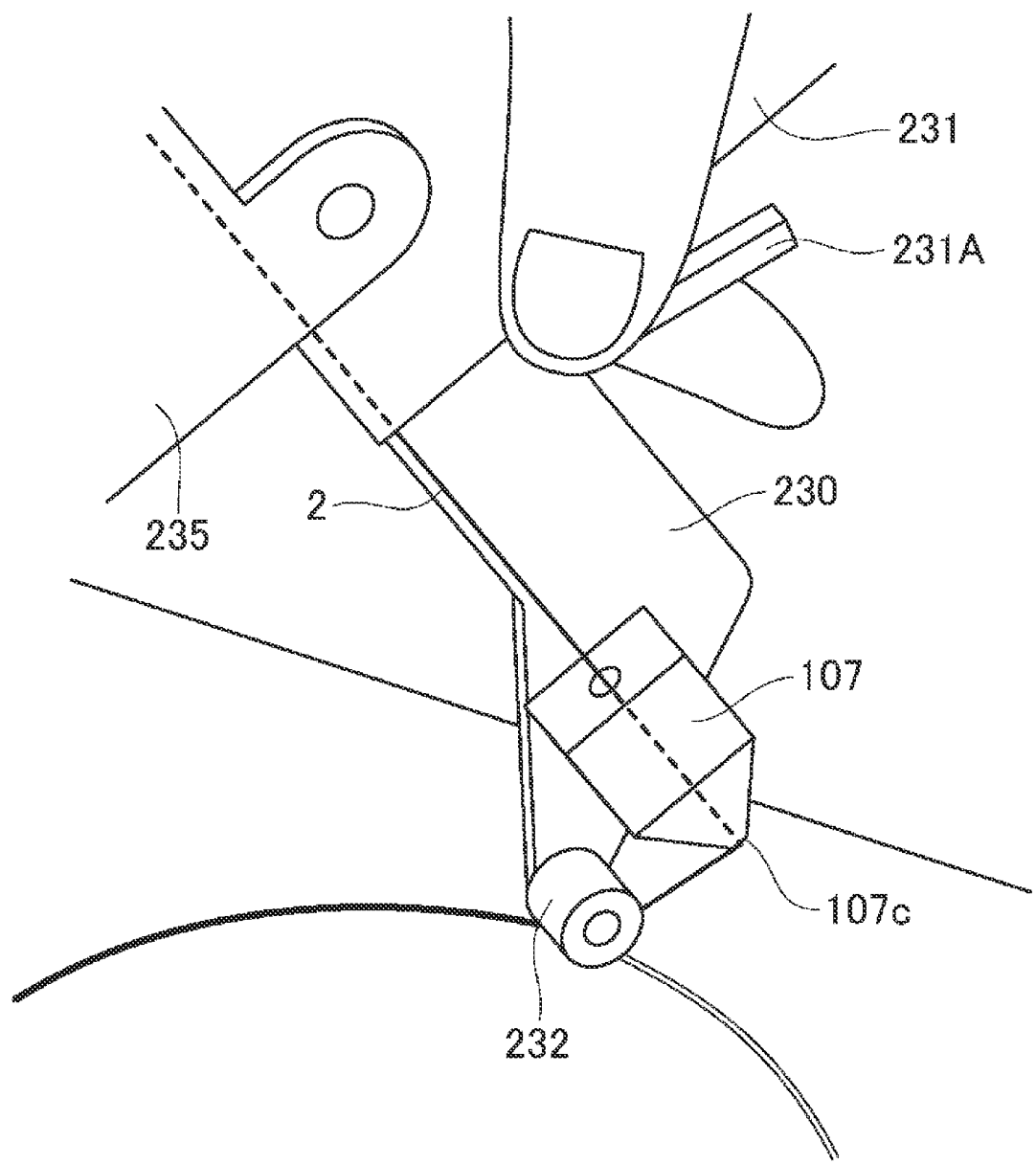

FIG. 26 is a view illustrating a state where a threadlike adhesive is cut at the end of a sticking operation using the threadlike adhesive sticking apparatus according to the fifth embodiment.

Figure 27:
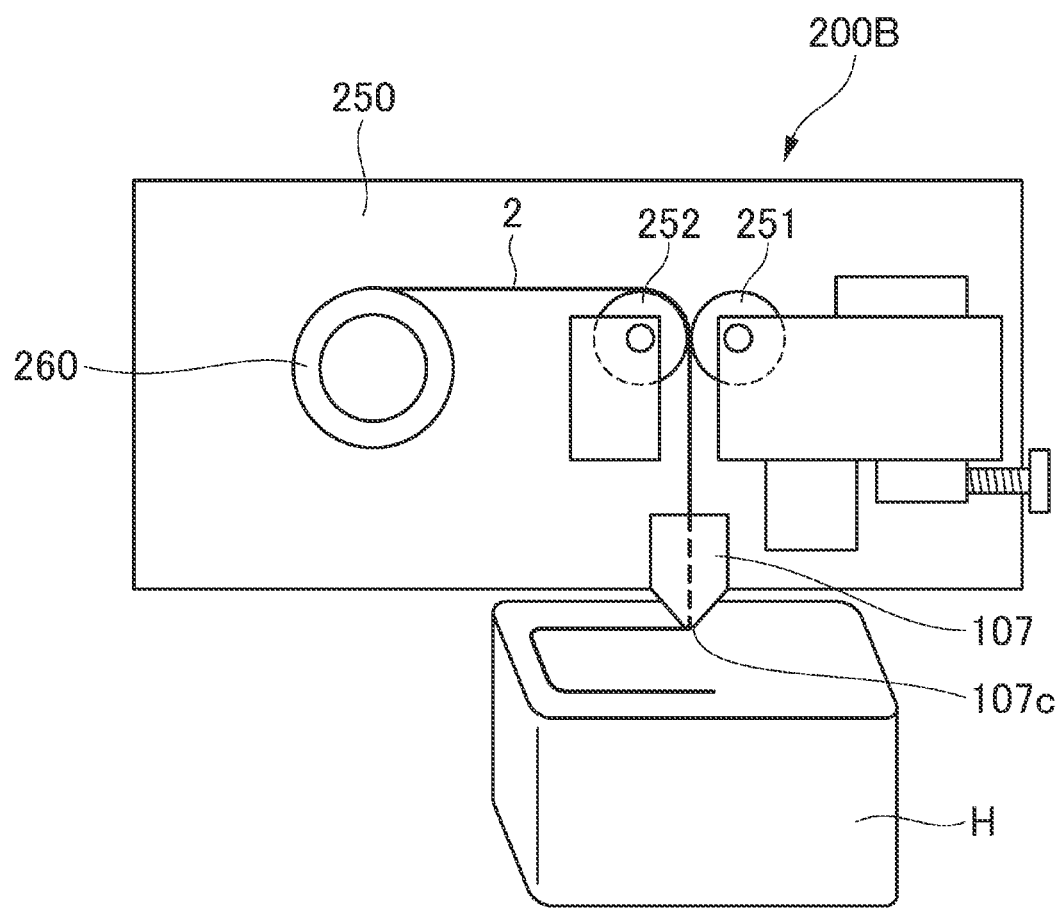

FIG. 27 is a schematic view illustrating a threadlike adhesive sticking apparatus according to a sixth embodiment.

Figure 28:
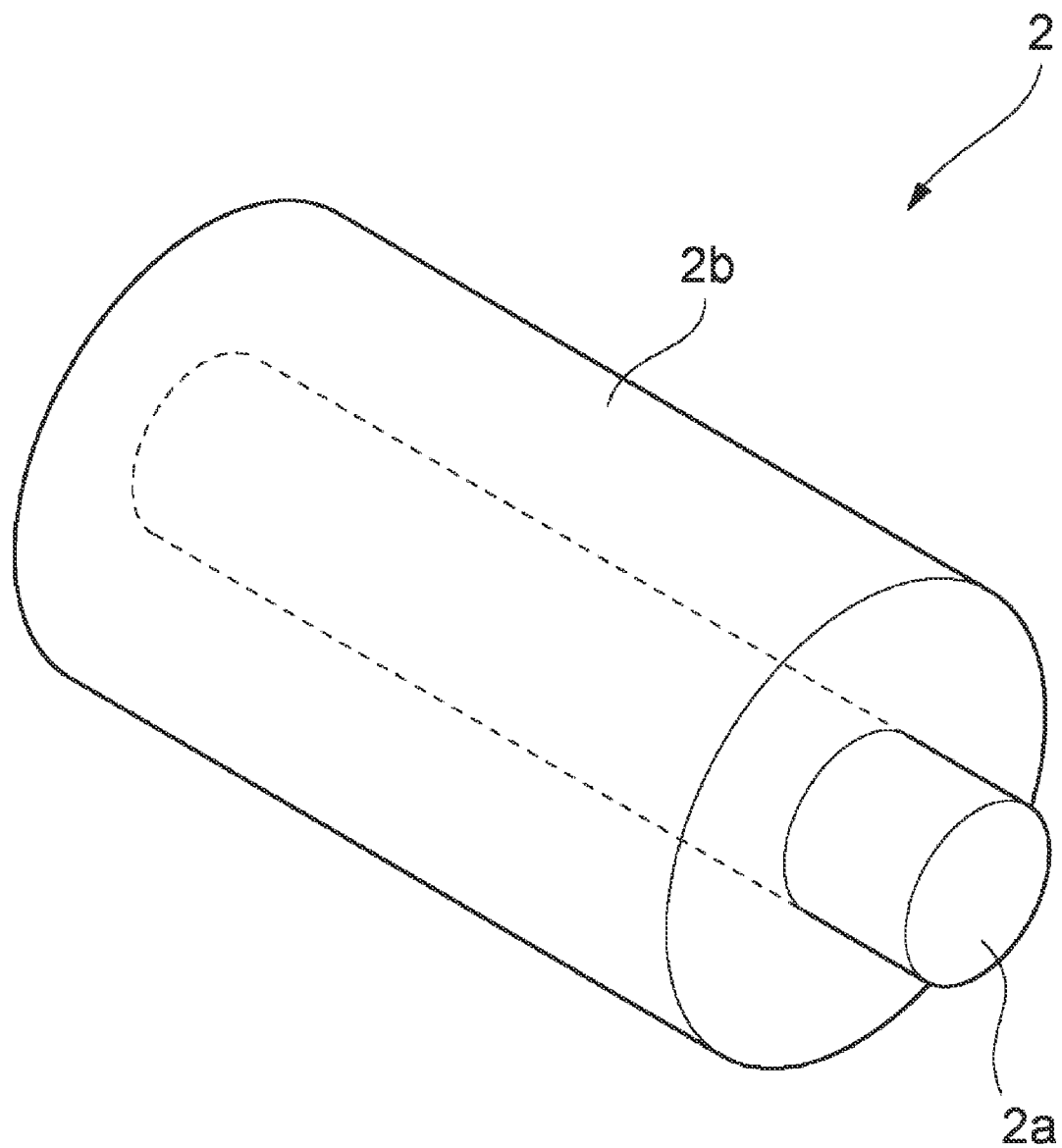

FIG. 28 is a schematic view illustrating a threadlike adhesive used in the threadlike adhesive sticking apparatus.

DESCRIPTION OF EMBODIMENTS

Hereinafter, threadlike adhesive sticking apparatuses according to preferred embodiments of the present invention will be described in detail with reference to the drawings.

First Embodiment

Figure 1:
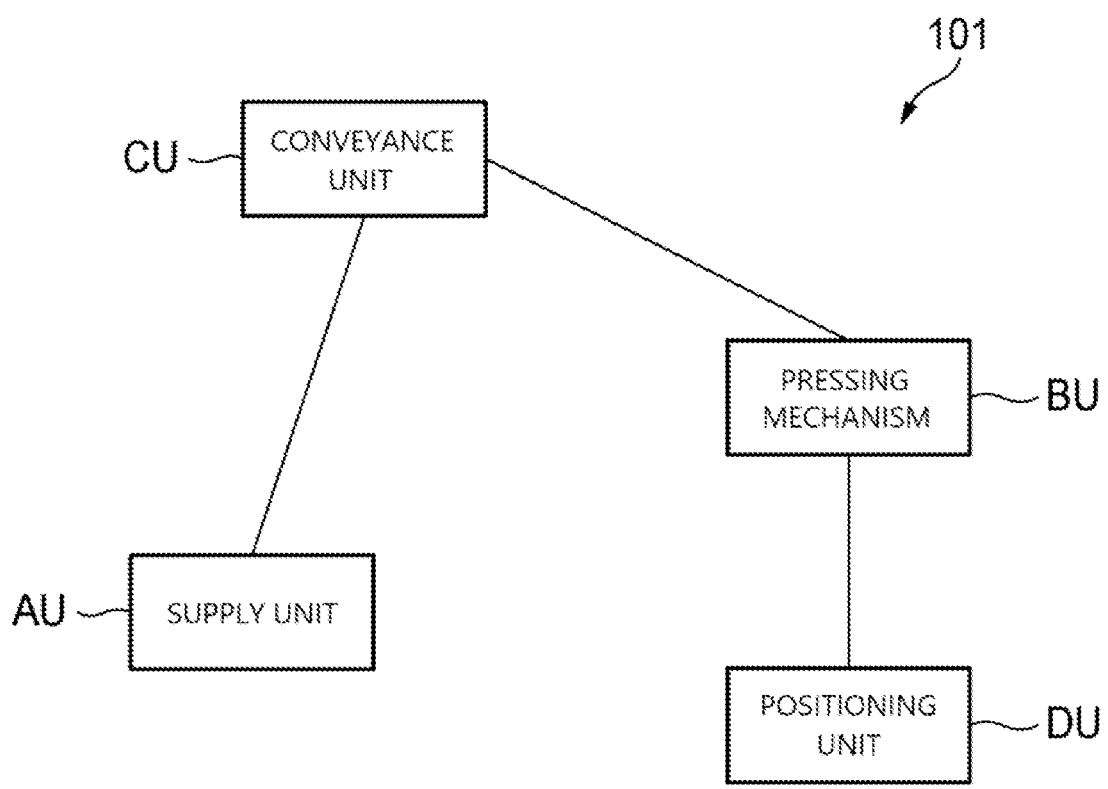
FIG. 1 is a view conceptually illustrating a configuration of a threadlike adhesive sticking apparatus according to a first embodiment of the present invention.
Figure 2:
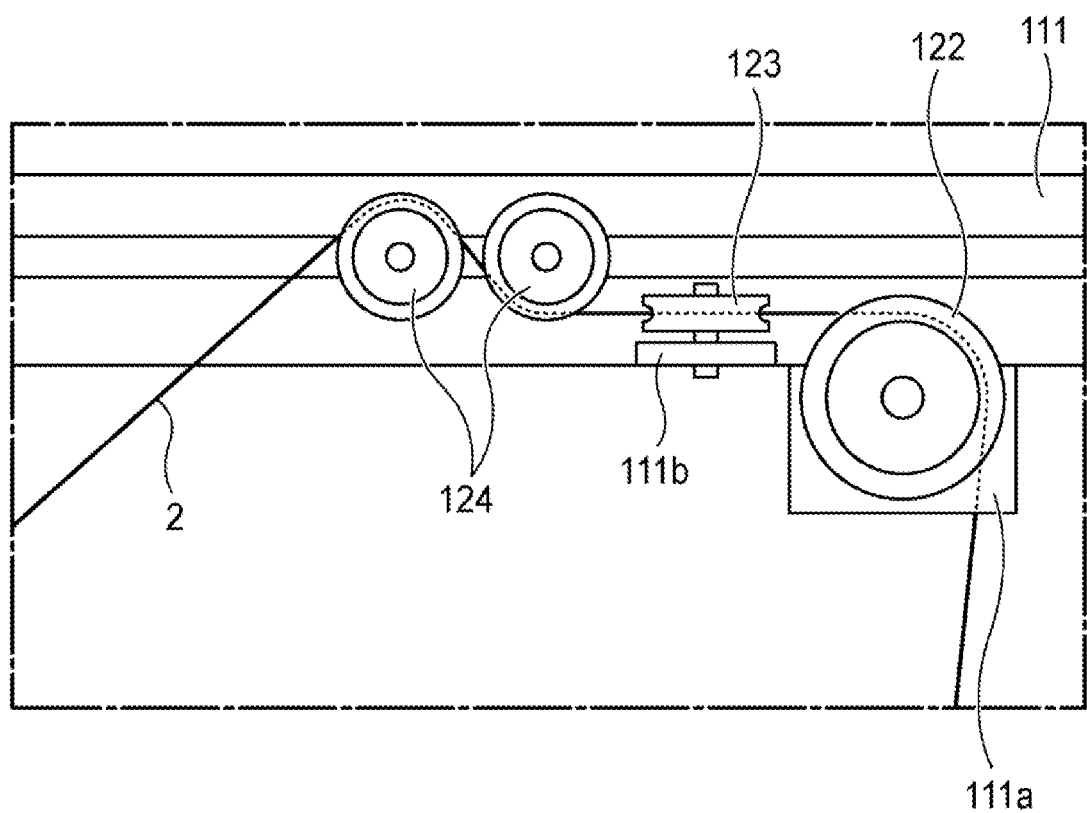
FIG. 2 is a view (1) illustrating a specific example of a conveyance path of a threadlike adhesive in the threadlike adhesive sticking apparatus of the first embodiment.
Figure 2:
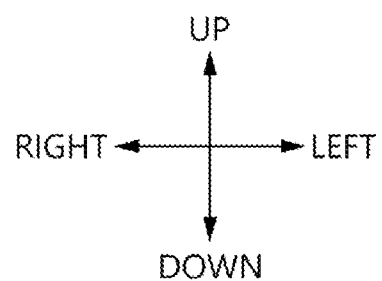
Figure 3:
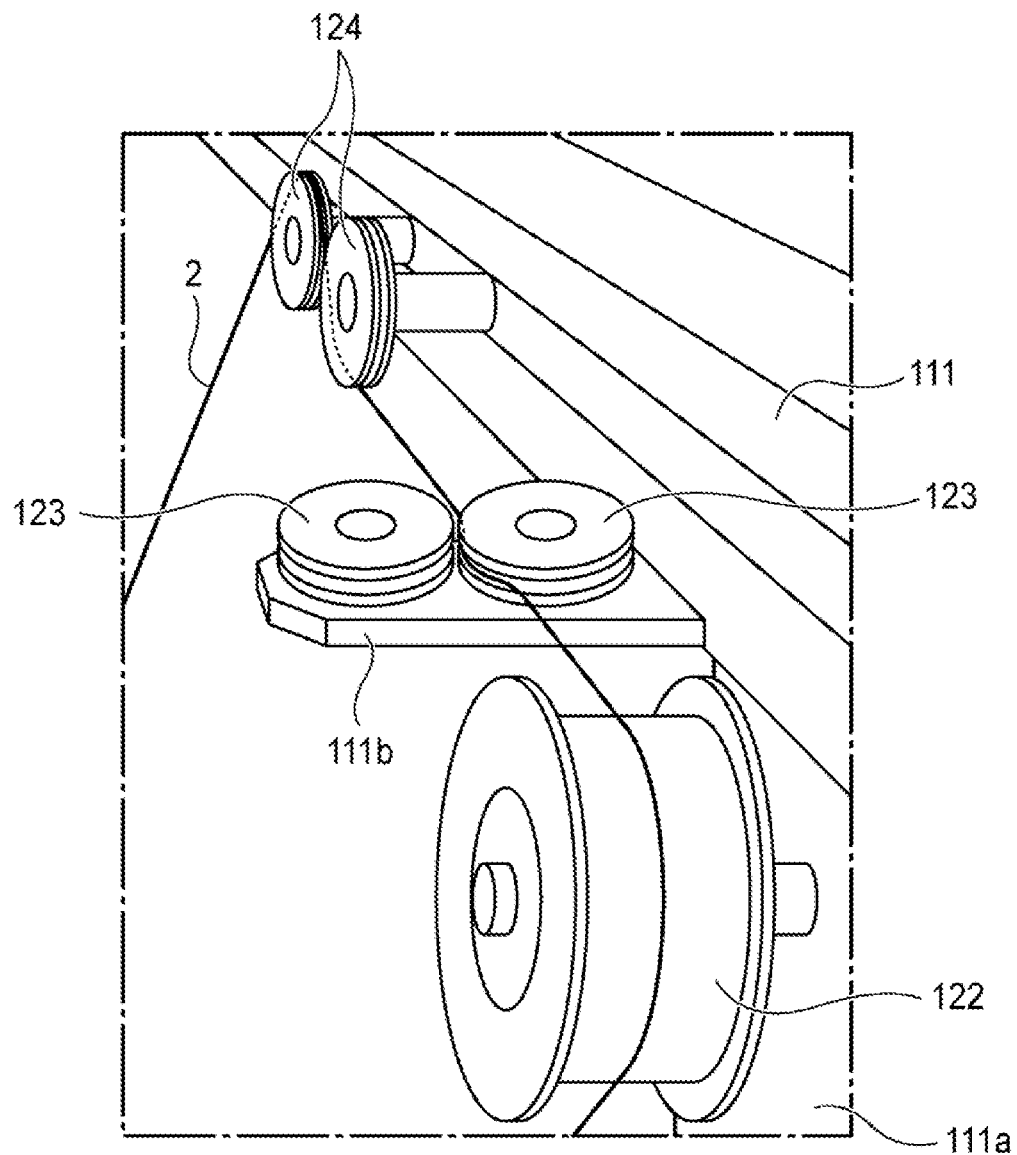
FIG. 3 is a view (2) illustrating a specific example of the conveyance path of the threadlike adhesive in the threadlike adhesive sticking apparatus of the first embodiment.
Figure 3:
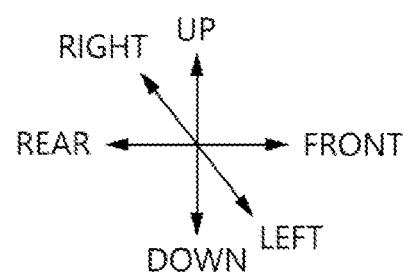
Figure 4:
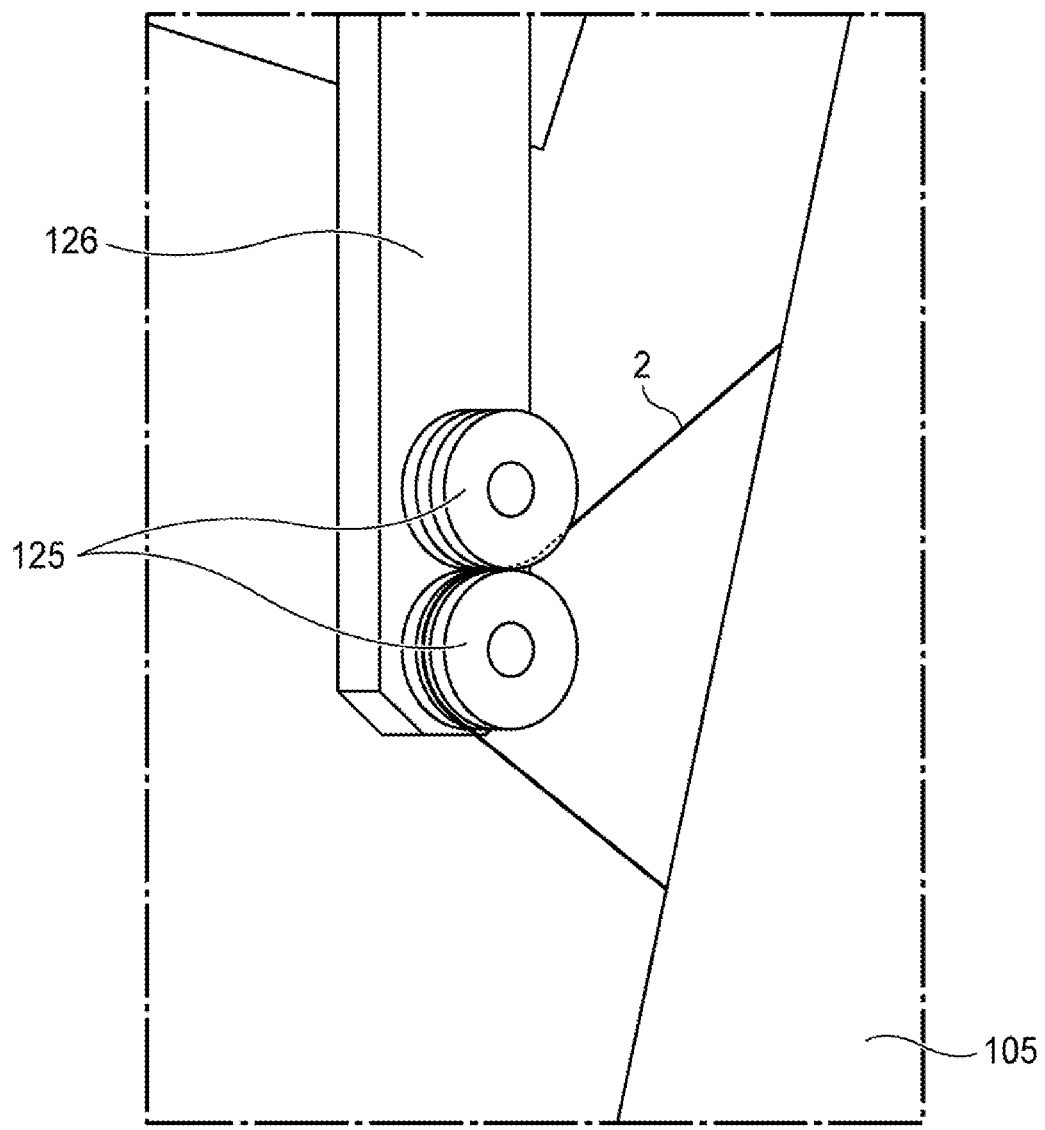
FIG. 4 is a view (3) illustrating a specific example of the conveyance path of the threadlike adhesive in the threadlike adhesive sticking apparatus of the first embodiment.
Figure 4:
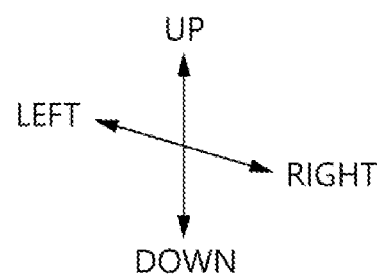
Figure 5:
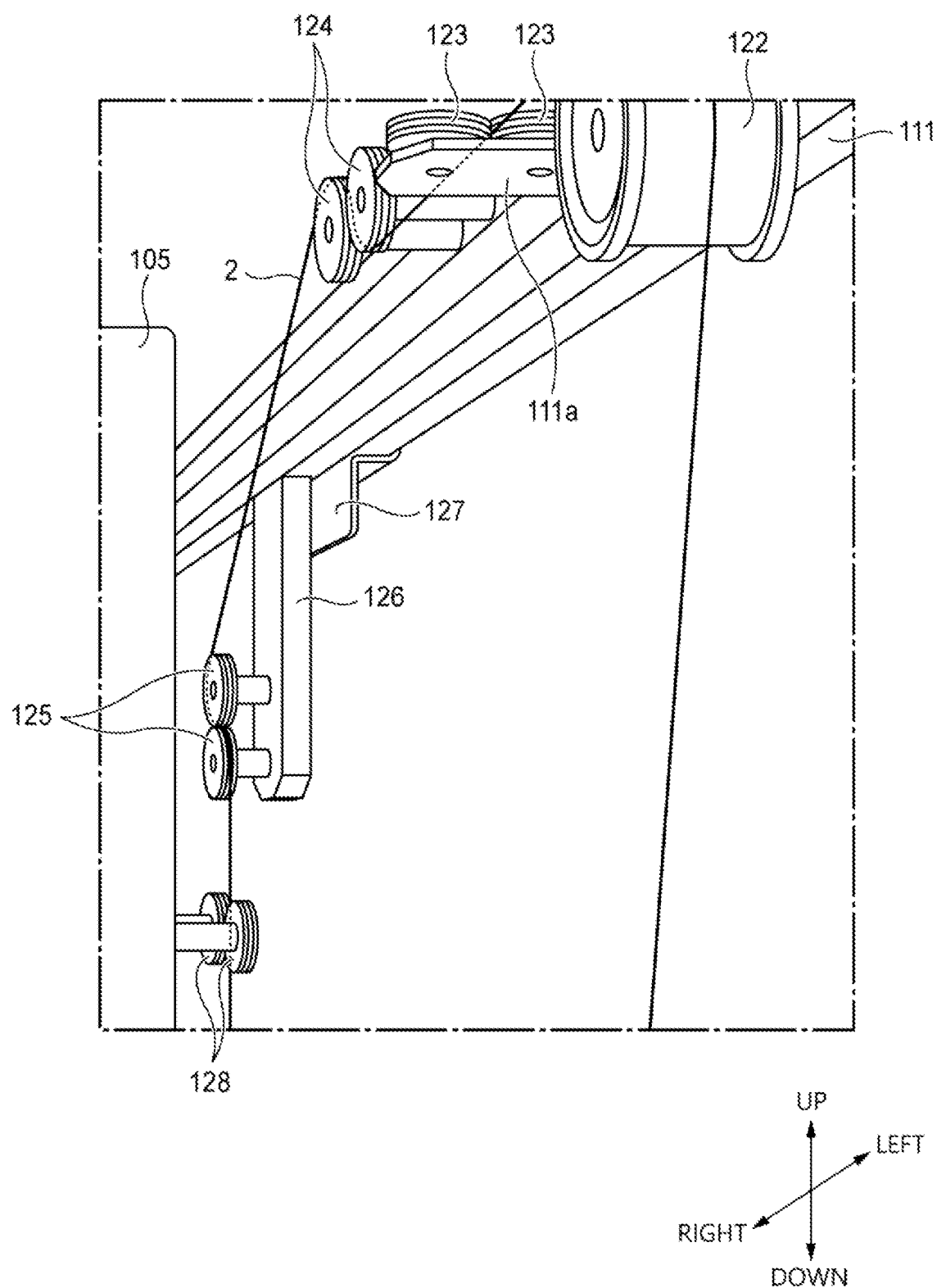
FIG. 5 is a view (4) illustrating a specific example of the conveyance path of the threadlike adhesive in the threadlike adhesive sticking apparatus of the first embodiment.

FIG. 1 is a view conceptually illustrating a configuration of a threadlike adhesive sticking apparatus according to a first embodiment of the present invention. FIGS. 2 to 5 are views illustrating specific examples of a conveyance path of a threadlike adhesive in the threadlike adhesive sticking apparatus according to the first embodiment. FIG. 2 and FIG. 4 are views illustrating the threadlike adhesive sticking apparatus as viewed from a rear side. FIG. 3 and FIG. 5 are views illustrating the threadlike adhesive sticking apparatus as viewed from a left side. Arrows shown in FIG. 2 to FIG. 8 indicate front-rear, left-right, and up-down directions of the threadlike adhesive sticking apparatus. The front-rear direction is also referred to as an X-axis direction, the left-right direction (width direction) is also referred to as a Y-axis direction, and the up-down direction (height direction) is also referred to as a Z-axis direction.

A threadlike adhesive sticking apparatus 101 is an apparatus configured to press and stick a threadlike adhesive 2 to an object (adherend). The threadlike adhesive sticking apparatus 101 mainly includes a supply unit AU, a pressing mechanism BU (nozzle), a conveyance unit CU, and a positioning unit DU as shown in FIG. 1. The supply unit AU supplies the threadlike adhesive 2 wound in a roll shape. The pressing mechanism BU is configured to press the supplied threadlike adhesive 2 against the adherend. The conveyance unit CU configured to convey the threadlike adhesive 2 from the supply unit AU to the pressing mechanism BU. The positioning unit DU is configured to position the pressing mechanism BU relative to the object.

(Positioning Unit DU)

The threadlike adhesive sticking apparatus 101 includes a table disposed on a base and a stage that is slidable on the table along the X-axis direction (front-rear direction), as a part constituting an example of the positioning unit DU. The object is placed on an upper surface of the stage and mounted by suction or the like. When the stage is moved in the X-axis direction by a driving unit, the object is moved in the X-axis direction. In addition, the threadlike adhesive sticking apparatus 101 includes, for example, a pair of support columns erected on left and right sides of the table, and a horizontal arm installed between the pair of support columns along the Y-axis direction (left-right direction) above the pair of support columns.

A horizontal moving unit 105 (see FIG. 5) that is slidable along the Y-axis direction is attached to the horizontal arm. The horizontal moving unit 105 is moved in the Y-axis direction by a driving unit (not shown). The horizontal moving unit 105 has a substantially rectangular parallelepiped shape, and a lifting body (not shown) provided below is slidably held in the Z-axis direction (up-down direction). A nozzle 107 is attached to the lifting body via an attachment plate 106. That is, in the horizontal moving unit 105, the nozzle 107 is configured to move in the Z-axis direction by a driving unit (not shown). Details of the nozzle 107 will be described later.

In the threadlike adhesive sticking apparatus 101, the nozzle 107 can be positioned relative to the object in an XY plane by the stage and the horizontal moving unit 105, and the nozzle 107 can be moved in the Z-axis direction by raising and lowering the lifting body of the horizontal moving unit 105. That is, the stage and the horizontal moving unit 105 function as the positioning unit DU.

(Supply Unit AU)

The threadlike adhesive sticking apparatus 101 includes a winding body and a winding body holding unit as an example of the supply unit AU. The winding body has a cylindrical shape such as a reel, a paper tube, and a bobbin. The threadlike adhesive 2 obtained by applying an adhesive to a threadlike core material is wound around an outer peripheral surface of the winding body. The winding body can be formed of a metal, a resin, an easily debondable material, or the like. The winding body holding unit is configured to hold the winding body such that movement of the winding body in the front-rear direction is restricted in the vicinity of both ends of the winding body around which the threadlike adhesive 2 is wound, and the winding body is rotatable as the threadlike adhesive 2 is conveyed (fed out). The threadlike adhesive 2 is an adhesive body obtained by covering a surface of a threadlike core material with an adhesive layer. Details of the threadlike adhesive 2 will be described later.

The threadlike adhesive sticking apparatus 101 can supply the threadlike adhesive 2 wound in a roll shape by the winding body and the winding body holding unit. That is, the winding body and the winding body holding unit function as the supply unit AU.

(Conveyance Unit CU)

The threadlike adhesive sticking apparatus 101 includes a roller 122 and each pair of rollers 123, 124, 125, and 128 as an example of the conveyance unit CU, and is configured to convey the threadlike adhesive 2 fed out from the supply unit AU (winding body) to the nozzle 107. In the roller 122 and each pair of rollers 123, 124, 125, and 128, at least the outer peripheral surface (rotating surface) in contact with the threadlike adhesive 2 is a non-adhesive surface. That is, at least the outer peripheral surface of each roller in contact with the threadlike adhesive 2 is formed of, for example, at least one of a fluorine resin, a silicone resin, and a polyolefin resin. Alternatively, at least the outer peripheral surface of each roller in contact with the threadlike adhesive 2 is subjected to a non-adhesive treatment by, for example, at least one of fluorine coating, silicone coating, long-chain alkyl coating, and Tosical (registered trademark) coating. The treatment of the fluorine coating includes a treatment with a fluorine resin heat-shrinkable tube and a treatment with a fluorine resin fabric sheet. Alternatively, at least the outer peripheral surface of each roller in contact with the threadlike adhesive 2 may be subjected to various non-adhesive treatments on the base material. For example, the base material may be subjected to blasting to have an uneven face, and concave portions may be coated with a non-adhesive substance, or the base material may be treated with PEEK (polyether ether ketone) coating, fluorine composite electroless nickel plating (in which fine particles of a fluorine resin are dispersed and co-deposited in a film of electroless nickel plating), Biceram (fluorine resin coating containing micronized ceramic particles), fiber reinforced plastics (FRP) lining, ultrahigh molecular polyester (PE) lining, or the like.

The roller 122 and each pair of rollers 123 and 124 are attached to a rear side of a frame 111. The frame 111 is installed, along the Y-axis direction, between a pair of frames erected on a left side of the winding body holding unit 121 and a right side of the table on the base.

The roller 122 is rotatably attached to a rectangular attachment portion 111a extending downward in the vicinity of a left end portion of the frame 111, in a perpendicular plane (YZ plane). As shown in FIG. 3, the roller 122 preferably has a bobbin shape having flanges at both ends. When the threadlike adhesive 2 is fed out from the winding body, the threadlike adhesive 2 is moved in a width direction of the body of the roller 122, and the threadlike adhesive 2 is less likely to fall off from the roller 122 due to the flanges at both ends. The pair of rollers 123 is rotatably attached to a rectangular attachment portion 111b extending in the front-rear direction on a right side of the attachment portion 111a on the frame 111, in a horizontal plane (XY plane). On the attachment portion 111b, the pair of rollers 123 is disposed adjacent to the front and rear so as to be separated from each other so that the threadlike adhesive 2 can be allowed to pass therebetween while being guided by the rotating surfaces of the pair of rollers 123 (see FIG. 3). The threadlike adhesive 2, which has been fed upward from the winding body and has been allowed to pass through the rotating surfaces (outer peripheral surfaces) of the roller 122 on the left side and the upper side as shown in FIG. 2, is allowed to pass between the pair of rollers 123 and reaches the pair of rollers 124 as shown in FIG. 3.

The pair of rollers 124 is rotatably attached in the perpendicular plane on the right side of the pair of rollers 123 on the frame 111. The pair of rollers 124 are disposed adjacent to the left and right so as to be separated from each other so that the threadlike adhesive 2 can be allowed to pass therebetween while being guided by the rotating surfaces of the pair of rollers 124 (see FIG. 2 and FIG. 3). As shown in FIG. 3, the threadlike adhesive 2, which has been allowed to pass between the pair of rollers 123, is allowed to pass through the upper rotating surface of the right roller 124 from the lower rotating surface of the left roller 124, and reaches the pair of rollers 125. The pair of rollers 123 and the pair of rollers 124 can prevent meandering of the threadlike adhesive 2 fed out from the winding body, but these are not necessarily required, and the rollers 123 and 124 may not be provided.

The pair of rollers 125 is rotatably attached to a lower side of an oil damper 126 extending substantially in the Z-axis direction, in the perpendicular plane. An upper end portion of the oil damper 126 is rotatably fixed to a damper attachment portion having a substantially rectangular shape, in the perpendicular plane. The damper attachment portion protrudes downward substantially at the center of the frame 111 in the Y-axis direction. The pair of rollers 125 is disposed adjacent to each other along an extending direction of the oil damper so as to be separated from each other so that the threadlike adhesive 2 can be allowed to pass therebetween while being guided by the rotating surfaces of the pair of rollers 125 (see FIG. 4). As shown in FIG. 5, the threadlike adhesive 2, which has been allowed to pass between the pair of rollers 124, is allowed to pass through the right and lower rotating surfaces of the upper roller 125, is allowed to pass through the upper and left rotating surfaces of the lower roller 125, and reaches a pair of rollers 128. The threadlike adhesive 2 guided by the pair of rollers 125 is prevented from slackening by a lower part of the oil damper 126 swinging slowly to the left and right. The pair of rollers 125 and the oil damper 126 may not be provided. This is because, changing a location where the winding body is placed or a moving speed of the positioning unit DU prevents occurrence of the slackening of the threadlike adhesive 2 and this eliminates the need for the function of preventing the slackening by the pair of rollers 125 and the oil damper 126.

Figure 6:
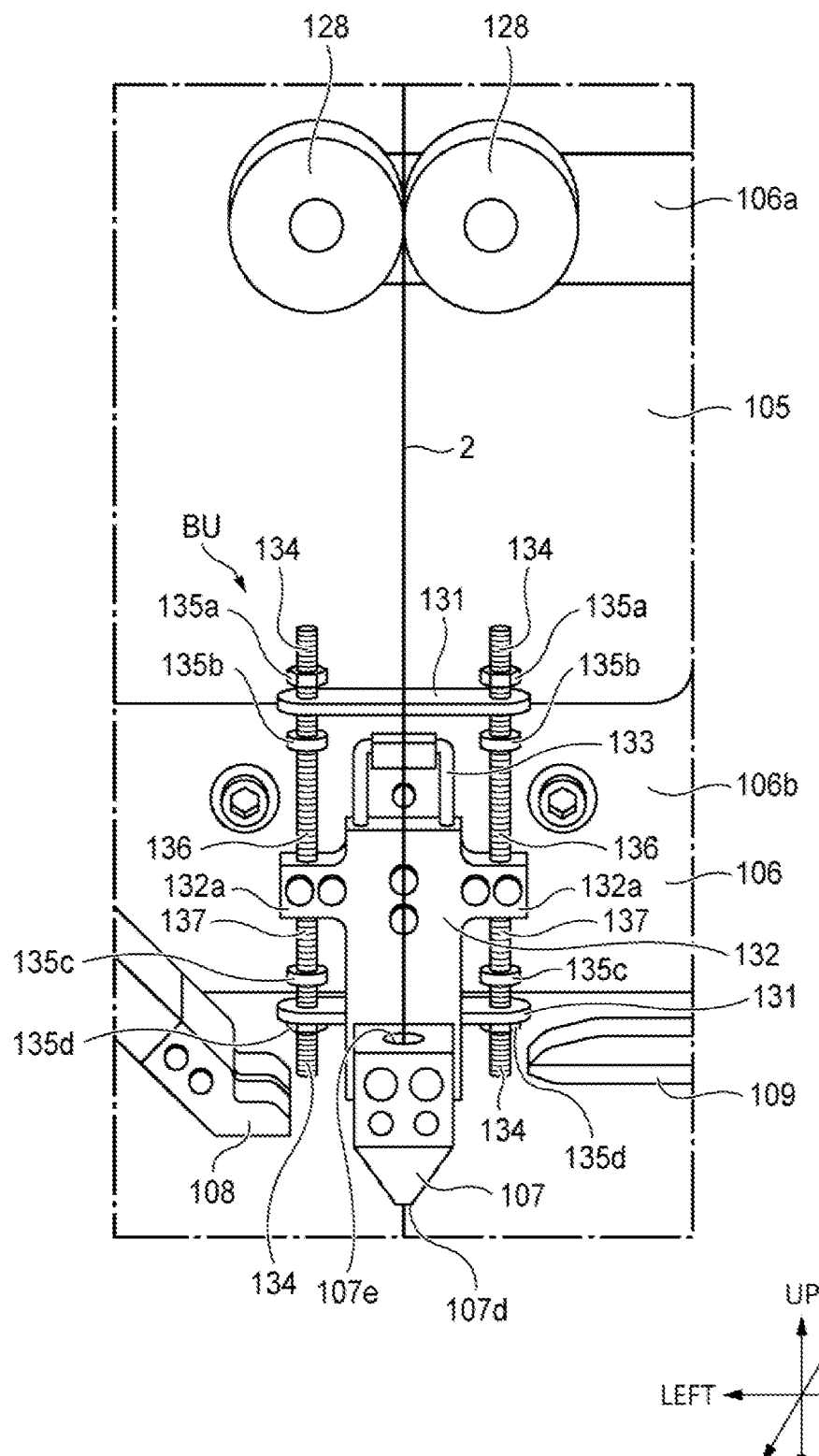
FIG. 6 is a view illustrating a periphery of a nozzle in the threadlike adhesive sticking apparatus of the first embodiment.

The pair of rollers 128 is rotatably attached to a roller attachment unit 106a of the attachment plate 106 disposed on a front of the horizontal moving unit 105, in the perpendicular plane. The pair of rollers 128 is disposed adjacent to the left and right so as to be separated from each other so that the threadlike adhesive 2 can be allowed to pass therebetween while being guided by the rotating surfaces of the pair of rollers 128. As shown in FIG. 6, the threadlike adhesive 2, which has been allowed to pass between the pair of rollers 125, is allowed to pass between the pair of rollers 128 and reaches the nozzle 107. Since the pair of rollers 128 is provided directly above the nozzle 107 attached to the attachment plate 106, the threadlike adhesive 2 is guided by the pair of rollers 128 and enters straight into a cylindrical internal space 107s (see FIG. 7) of the nozzle 107 regardless of the position of the nozzle 107. The pair of rollers 128 may be disposed adjacent up and down and guide the threadlike adhesive 2 to the position of the nozzle 107 by passing the threadlike adhesive 2 in an S-shape, or may guide the threadlike adhesive 2 to the position of the nozzle 107 by another configuration.

The threadlike adhesive sticking apparatus 101 is configured to convey the threadlike adhesive 2 from the supply unit AU to the pressing mechanism BU by the roller 122 and each pair of rollers 123, 124, 125, and 128. That is, the roller 122 and each pair of rollers 123, 124, 125, and 128 function as the conveyance unit CU. The conveyance unit CU may convey the threadlike adhesive 2 to, for example, a pressing unit configured to press the threadlike adhesive 2 against the adherend with a roller other than the pressing mechanism BU.

(Pressing Mechanism BU)

Figure 7:
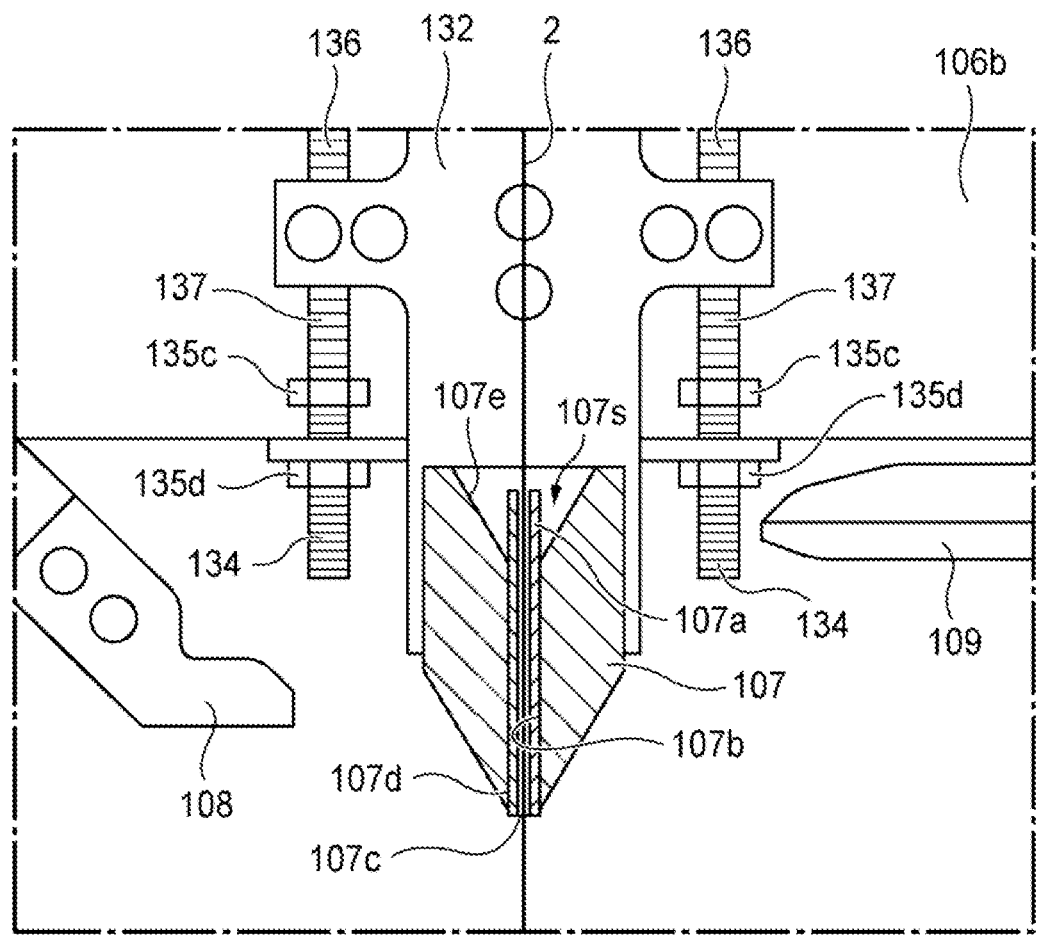
FIG. 7 is a view illustrating a cut surface of the nozzle.
Figure 8:
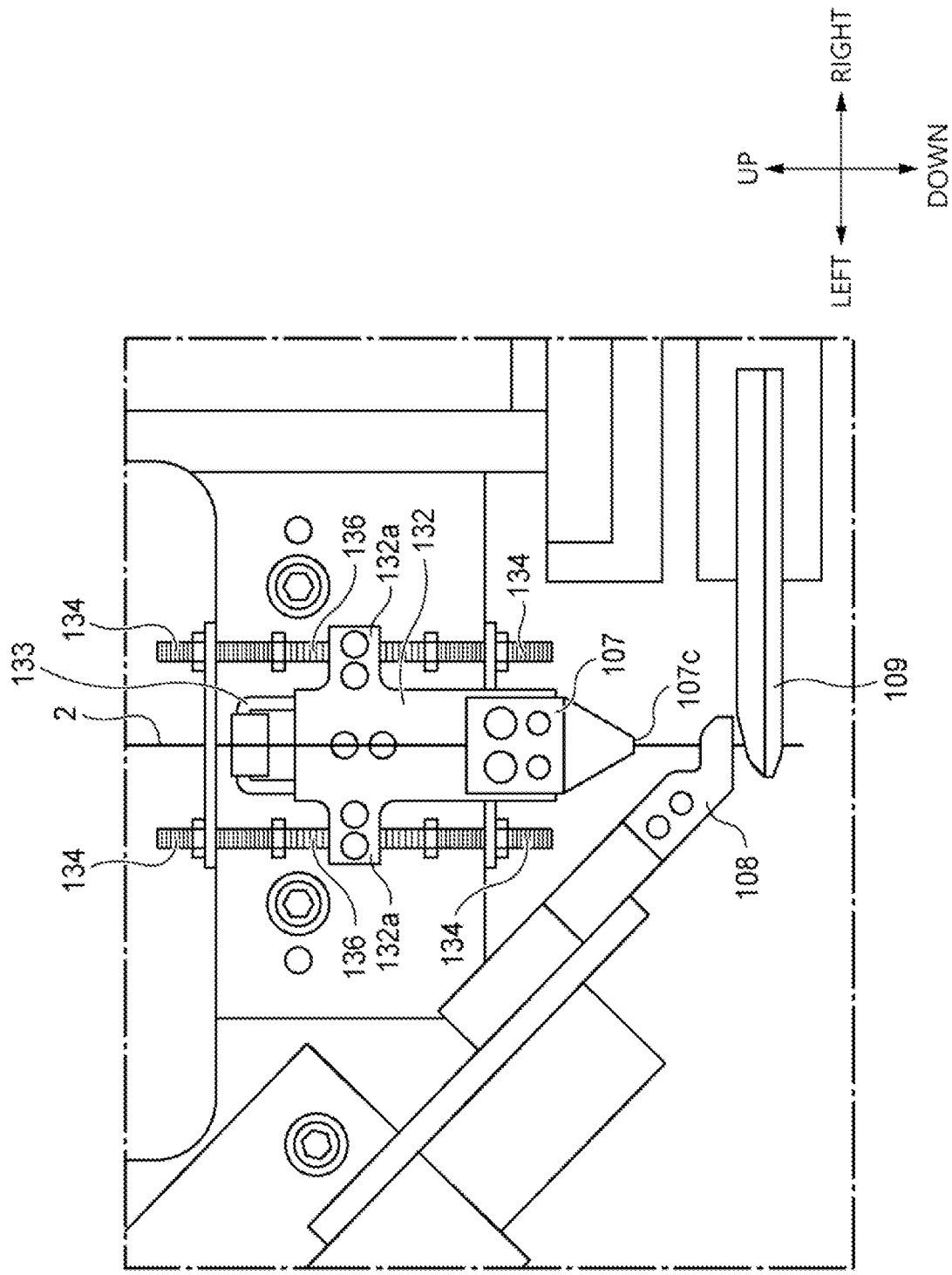
FIG. 8 is a view illustrating a periphery of the nozzle when the threadlike adhesive is cut.

An example of the pressing mechanism BU provided on the threadlike adhesive sticking apparatus 101 will be described with reference to FIGS. 6 to 8. FIGS. 6 to 8 are views illustrating the periphery of the nozzle 107 of the threadlike adhesive sticking apparatus 101. FIG. 6 is a perspective view illustrating the periphery of the nozzle 107 as viewed from a front upper side. FIG. 7 is a view including a cross-section of the nozzle 107 in the YZ plane along the threadlike adhesive 2. FIG. 8 is a view illustrating a state of cutting the threadlike adhesive 2.

The threadlike adhesive sticking apparatus 101 includes the attachment plate 106 and the nozzle 107 as a part constituting an example of the pressing mechanism BU. The attachment plate 106 is slidably attached in the Z-axis direction with respect to the horizontal moving unit 105 on the front side of the horizontal moving unit 105. The attachment plate 106 is a thin metal flat plate formed in a substantially U shape, and includes the roller attachment unit 106a, a nozzle attachment unit 106b (nozzle displacement unit), and a substantially rectangular connection portion elongated in the Z direction. The roller attachment unit 106a is a substantially rectangular portion extending in the Y-axis direction above the connection portion. The pair of rollers 128 are attached to the front side of the roller attachment unit 106a. The nozzle attachment unit 106b is a substantially rectangular portion extending in the Y direction below the connection portion. The nozzle 107, an air chuck 108, and an air scissor 109 are attached to the front side of the nozzle attachment unit 106b.

The nozzle 107 is a member formed of aluminum or the like and having a shape obtained by connecting a bottom surface of a cone to a lower surface of a cube. The nozzle 107 has an inner wall surface 107b that defines the cylindrical internal space 107s extending in the up-down direction, and a tip end 107d having a tip end opening 107c allowing the cylindrical internal space 107s to communicate with the outside at a lower end portion of the inner wall surface 107b. The nozzle 107 is a member formed of metal or the like, and the surface of the nozzle 107 including the inner wall surface 107b and the tip end 107d is subjected to a slidability improving treatment. The nozzle 107 has an insertion-side opening 107e at the upper end portion of the inner wall surface 107b, the insertion-side opening 107e allowing the cylindrical internal space 107s to communicate with the outside. The inner wall surface 107b is formed such that the cylindrical internal space 107s has a funnel shape in which a cylinder having the same diameter as the tip end opening 107c extends upward from the tip end opening 107c and gradually increases in diameter. The insertion-side opening 107e has a funnel shape whose diameter is larger than that of the tip end opening 107c. The inner wall surface 107b may define a cylindrical internal space, and for example, an upper portion of the inner wall surface 107b may be formed as a cylinder or the like having the same diameter instead of a funnel shape.

In the cylindrical internal space 107s of the nozzle 107, a tube 107a formed of a hardly adhesive resin such as polytetrafluoroethylene (PTFE) and having a hollow cylindrical shape from the upper end to below the lower end (tip end 107d) of the nozzle 107 may be provided. Alternatively, a surface treatment for improving slidability may be performed on the cylindrical internal space 107s. In the tube 107a, a diameter of the lower side opening is preferably, for example, about 1 mm, and a diameter of the threadlike adhesive 2 is preferably, for example, 0.45 mm. That is, a cross-sectional area of the lower side opening of the tube 107a is preferably about 4.9 times a cross-sectional area of the threadlike adhesive 2. The tube 107a protrudes slightly (for example, about 0.5 to 1 mm) from the lower end of the inner wall surface 107b. Inserting the threadlike adhesive 2 into the tube 107a allows for improving the slidability (feedability) of the threadlike adhesive 2. The insertion-side opening 107e is enlarged in diameter, and thus the threadlike adhesive 2 is easily inserted into the nozzle 107. In addition, when the material of the nozzle 107 itself is a hardly adhesive resin such as PTFE, the threadlike adhesive 2 can be prevent from adhering to the nozzle 107. As a result, the threadlike adhesive 2 can be smoothly fed out from the nozzle 107 without being caught, and thus the tube 107a is unnecessary. Further, a shape of the nozzle 107 is not limited as long as the nozzle 107 has a cylindrical internal space and a tip end having a tip end opening allowing the internal space to communicate with the outside. In addition, in the nozzle 107, a shape of the tip end opening 107c (or a lower side opening of the tube 107a) is preferably a circular shape or a polygonal shape having five or more corners.

The nozzle 107 presses the threadlike adhesive 2, which has been allowed to pass through the tube 107a (cylindrical internal space 107s) and has been led out to the outside from the lower side opening (tip end opening 107c) of the tube 107a, against the object. More specifically, an entire circumference or some positions of the lower end portion of the tube 107a, which is the peripheral portion surrounding the tip end opening 107c of the nozzle 107, function as the pressing unit configured to press the threadlike adhesive 2 against the object. This allows for sticking the threadlike adhesive while moving the nozzle 107 in any directions without using a roller or the like as the pressing unit. Therefore, this prevents a problem in the case of pressing the adhesive by the roller, that the adhesion accuracy is poor due to the movement of the adhesive within a roller width, and the adhesive is detached from the roller depending on an adhesion path. And, such a nozzle allows for accurately sticking the threadlike adhesive.

(Relationship Between Hole Diameter of Nozzle 107 and Diameter of Threadlike Adhesive 2)

A hole diameter of the nozzle 107 (diameter on an inner side (inner diameter), or a hole diameter of the tube 107a when the tube 107a is provided) is preferably 0.7 mm to 1 mm in diameter when the threadlike adhesive 2 has a diameter of 0.45 mm (a width of 0.6 mm in compression of about 0.3 MPa). When the hole diameter of the nozzle 107 is smaller than 0.7 mm, an area where the threadlike adhesive 2 contacts the inside of the nozzle 107 becomes large, and thus the threadlike adhesive 2 does not stick to the adherend. On the other hand, when the hole diameter of the nozzle 107 exceeds 1 mm and is too large, the threadlike adhesive 2 is moved inside the nozzle 107, and thus a sticking speed does not increase and the sticking accuracy deteriorates. Therefore, a ratio of the diameter of the threadlike adhesive 2 to the hole diameter of the nozzle 107 is preferably 0.45:0.7 to 1.

The nozzle 107 is configured to press the threadlike adhesive 2 against the object while the lower side opening (or the tip end opening 107c) of the tube 107a comes into contact with and slides on the adhesive surface of the threadlike adhesive 2. Specifically, the tip end 107d of the nozzle 107 (or the tip end of the tube 107a, at least a portion in contact with the adhesive surface) may be formed of at least one of a fluorine resin, a silicone resin, and a polyolefin resin. Alternatively, the tip end 107d of the nozzle 107 (or the tip end of the tube 107a, at least a portion in contact with the adhesive surface) is treated by at least one of fluorine coating, silicone coating, and long-chain alkyl coating. Alternatively, various slidability improving treatments described below are performed. The treatment of fluorine coating includes a treatment with a fluorine resin heat-shrinkable tube and a fluorine resin fabric sheet.

The tip end portion of the nozzle 107 may be subjected to various slidability improving treatments on the base material. For example, the base material may be treated with PEEK (polyether ether ketone) coating, fluorine composite electroless nickel plating (in which fine particles of a fluorine resin are dispersed and co-deposited in a film of electroless nickel plating), Biceram (fluorine resin coating containing micronized ceramic particles), fiber reinforced plastics (FRP) lining, ultrahigh molecular polyester (PE) lining, or the like. As a result, the threadlike adhesive 2 can be smoothly stuck to the object.

When the nozzle 107 to be in contact with the adhesive surface of the threadlike adhesive 2 is not hardly adhesive, a dynamic friction force between the tip end 107d coated/treated for improving slidability and the adhesive surface is preferably 3 N/mm or less. When the tube 107a formed of a hardly adhesive resin is inserted into the nozzle 107, a dynamic friction force between the lower side opening of the tube 107a and the adhesive surface of the threadlike adhesive 2 is preferably 3 N/mm or less. When the nozzle 107 itself is formed of a hardly adhesive resin such as PTFE (silicone, olefin, etc.), a dynamic friction force between the tip end opening 107c and the adhesive surface of the threadlike adhesive 2 is preferably 3 N/mm or less.

Depending on a shape and a material/surface treatment of the tip end portion of the nozzle 107 (details will be described later), the tip end portion of the nozzle 107 to be in contact with the adhesive surface of the threadlike adhesive 2 has a low frictional force with respect to the adhesive surface. In addition, the tip end portion of the nozzle 107 is formed of a material with reduced unevenness or is subjected to a surface treatment such that the portion has reduced unevenness, and thus this allows for preventing occurrence of scraping or the like when the soft threadlike adhesive 2 slides thereon. Therefore, the threadlike adhesive 2 can be smoothly stuck. The dynamic friction force between the tip end portion of the nozzle 107 and the adhesive surface of the threadlike adhesive 2 can be measured by the following method.

Figure 9:
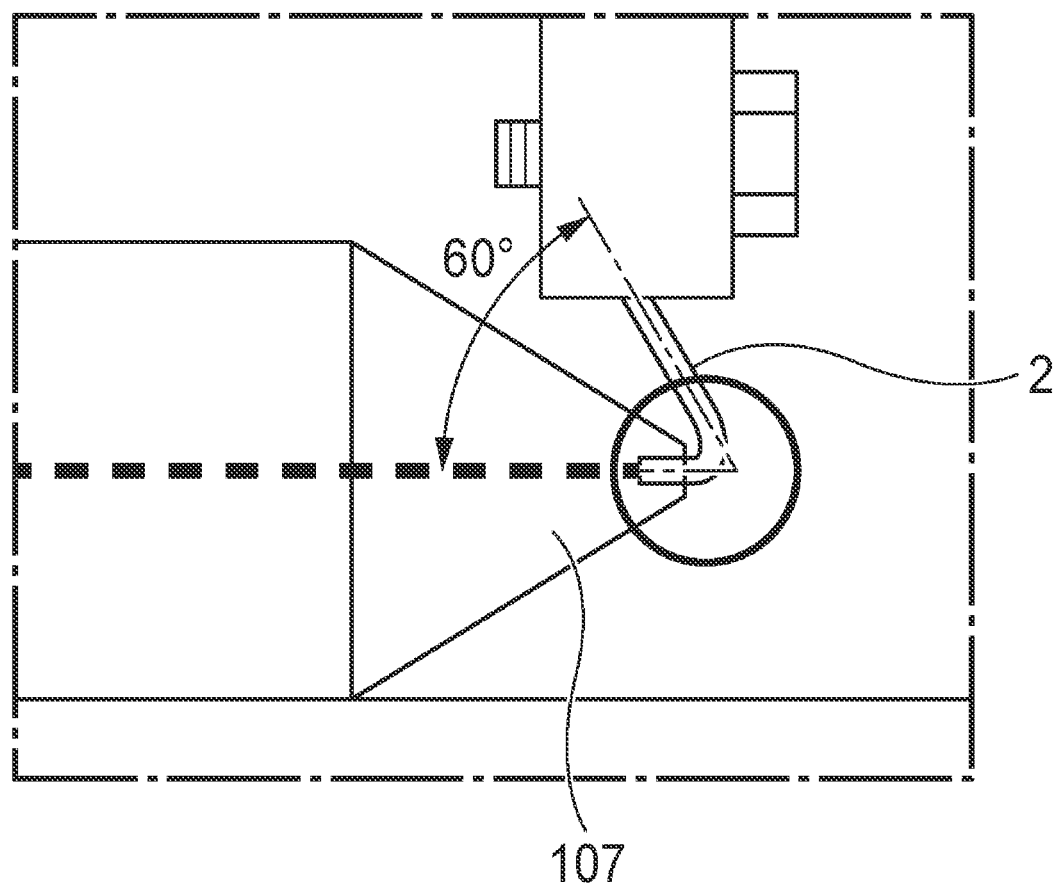
FIG. 9 is a view illustrating a method of measuring a dynamic friction force between a tip end portion of the nozzle and an adhesive surface of the threadlike adhesive.

As shown in FIG. 9, the nozzle 107 is placed on a horizontal plane so that the cylindrical internal space 107s extends in the horizontal direction, and the threadlike adhesive 2 inserted from the insertion-side opening 107e is pulled out from the tip end opening 107c. The threadlike adhesive 2 is set so that an angle formed by the threadlike adhesive 2 which has been allowed to pass through the cylindrical internal space 107s and the threadlike adhesive 2 pulled out from the tip end opening 107c is 60 degrees. By setting in this manner, the threadlike adhesive 2 reliably comes into contact with the tip end portion of the nozzle 107. On an insertion-side opening 107e side, tension is applied to the threadlike adhesive 2 with a weight of 10 g. In this state, the threadlike adhesive 2 pulled out from the tip end opening 107c is pulled upward in the vertical direction at 1 mm/sec, and a stress (value at the time of stabilization) is measured. At this time, a width (thickness) of the threadlike adhesive 2 that has pressed against the nozzle tip end indicated by a circle in FIG. 9 is, for example, 0.4 mm. A value obtained by dividing a value of a stress when the threadlike adhesive 2 is being moved in this way by the width of the threadlike adhesive 2 is defined as the dynamic friction force.

Since the tip end portion of the nozzle 107 in the present embodiment has a dynamic friction force of 3 N/mm or less with respect to the adhesive surface of the threadlike adhesive 2, the threadlike adhesive 2 can be smoothly stuck. In addition, the dynamic friction force between the tip end portion of the nozzle 107 and the adhesive surface of the threadlike adhesive 2 is preferably 1 N/mm or less. The dynamic friction force between the tip end portion of the nozzle and the adhesive surface of the threadlike adhesive 2 is 3 N/mm or less, even when the width (thickness) of the threadlike adhesive 2 that has pressed against the nozzle tip end is not 0.4 mm, and also when the width (thickness) of the threadlike adhesive 2 that has pressed against the nozzle tip end is 0.2 mm to 0.45 mm or other sizes.

Furthermore, when the shape of the tip end opening 107c (or the lower side opening of the tube 107a) is a circular shape or a polygonal shape having five or more corners, the nozzle 107 can easily change a sticking direction.

The parts (a) and (b) of FIG. 10 are enlarged cross-sectional views of the tip end 107d of the nozzle 107, and show an example of the nozzle 107 having a shape different from that described above. The nozzle 107 may be formed of a hardly adhesive resin such as fluorine resin, or may be a nozzle formed of a metal and whose surface has been subjected to a slidability improving treatment. In the part (a) of FIG. 10, the tip end 107d has a corner, and the threadlike adhesive 2 may be caught, displaced, or cut. In the part (b) of FIG. 10, the tip end 107d is round, that is, the portion pressing the threadlike adhesive 2 is a curved surface, and thus, the threadlike adhesive 2 is not caught and can be favorably stuck. When the nozzle 107 shown in the part (b) of FIG. 10 is formed of a resin such as fluorine resin, the nozzle 107 may be protected by passing the nozzle 107 through a guide formed of stainless steel (SUS).

The nozzle 107 is configured to be movable in the up-down direction and to include an absorption mechanism configured to absorb a displacement of the nozzle 107 with respect to a displacement of a base to which the nozzle 107 is attached in the up-down direction. Hereinafter, an example of this configuration will be described, but the configuration related to the displacement of the nozzle is not limited to the following configuration. The nozzle 107 is fixed to a slider 132 movable in the up-down direction along a slide rail 133. The slider 132 has a substantially rectangular parallelepiped shape and has bulging portions 132a in which portions of the left and right side surfaces of the slider 132 protrudes to the left and right sides of the slider 132, respectively.

The slide rail 133 is attached to the front of the nozzle attachment unit 106b along the up-down direction. Two bolts 134 and springs 136 and 137 disposed between the two bolts 134 are respectively provided on the left and right sides of the slide rail 133 along the up-down direction. The bolts 134 are inserted through the left and right end portions of horizontally long bolt insertion portions 131 in the up-down direction. The bolt insertion portion 131 extends forward from an upper side and a lower side of the nozzle attachment unit 106b, separately. Nuts 135a and 135b are respectively disposed on left and right sides above and below the upper bolt insertion portion 131, and are screwed to the bolts 134. Nuts 135c and 135d are respectively disposed on the left and right sides above and below the lower bolt insertion portion 131, and are screwed to the bolts 134.

The spring 136 is disposed between the nut 135b and the upper portion of the bulging portion 132a, and the spring 137 is disposed between the lower portion of the bulging portion 132a and the nut 135c. A lower end portion of the upper bolt 134 is inserted into an upper side of the spring 136, and a lower side of the spring 136 is fixed to the bulging portion 132a, thereby preventing the spring 136 from being detached. The upper side of the spring 137 is fixed to the bulging portion 132a, and the upper end portion of the lower bolt 134 is inserted into the lower side of the spring 137, thereby preventing the spring 137 from being detached.

The nozzle 107 is fixed to the slider 132, and the nozzle 107 is displaced in accordance with the displacement of the slider 132 in the up-down direction. Specifically, as the lifting body of the horizontal moving unit 105 is raised and lowered (displaced), the nozzle attachment unit 106b fixed to the lifting body is raised and lowered (displaced). Here, the springs 136 and 137 are attached to the upper part and lower part of the slider 132 slidably attached to the nozzle attachment unit 106b. The slider 132 does not slide, and a position of the slider 132 on the nozzle attachment unit 106b does not change in a state where no load is applied to the nozzle 107. On the other hand, when the nozzle 107 is pressed against the object via the threadlike adhesive 2, an elastic force in a direction opposite to the pressing direction is generated in the springs 136 and 137. That is, the springs 136 and 137 absorb the displacement of the nozzle 107 with respect to the displacement of the nozzle attachment unit 106b. As a result, this allows for controlling a force (pressing force) with which the nozzle 107 presses the threadlike adhesive 2 against the object to prevent the pressing force from excessively increasing or rapidly increasing. Therefore, it is possible to prevent a large deformation of the threadlike adhesive 2, that is, a problem such as sticking out of the adhesive (lowering of adhesion width accuracy) or unevenness of the height of the threadlike adhesive 2 due to an excessively strong pressing force, and to achieve the appropriate adhesive force of the threadlike adhesive. In addition, it is possible to protect the apparatus by preventing an excessive load from being applied to the nozzle 107.

In this way, the springs 136 and 137 function as an absorption mechanism configured to absorb the displacement of the nozzle 107 with respect to the displacement of the nozzle attachment unit 106b, and gently change the pressing force. Therefore, even when a height of an adhesive surface of the object changes depending on the accuracy or when the adhesive surface of the object is not smooth and has unevenness, the above-described problem can be prevented. In addition, even in a portion where the threadlike adhesive 2 overlaps in the sticking path, the threadlike adhesive 2 can be smoothly stuck over the stuck threadlike adhesive 2 due to the function of the springs 136 and 137. Instead of the springs 136 and 137, an oil damper or an air cylinder may be attached between the nozzle attachment unit 106b and the nozzle 107 to function as an absorption mechanism. The pressing mechanism BU described above is merely an example. The pressing mechanism BU may have another configuration such that the nozzle 107 is movable in the up-down direction, and includes an absorption mechanism configured to absorb the displacement of the nozzle 107 with respect to the displacement of the base to which the nozzle 107 is attached in the up-down direction.

The air chuck 108 and the air scissor 109 are attached to the nozzle attachment unit 106b on the left and right sides of the nozzle 107, respectively (see FIG. 6 and FIG. 7). When the sticking of the threadlike adhesive 2 is completed, the air chuck 108 and the air scissor 109 are separately moved from a normal position shown in FIG. 6 and FIG. 7 to a position shown in FIG. 8 by a driving unit. The air chuck 108 is moved obliquely from the normal position to the lower right, and chucks the threadlike adhesive 2 directly below the nozzle 107. The air scissor 109 is moved downward from the normal position and then moved leftward to cut the chucked threadlike adhesive 2 directly below the air chuck 108. The air chuck 108 and the air scissor 109 are attached to the lifting body of the horizontal moving unit 105 via the attachment plate 106, like the nozzle 107, and thus, the air chuck 108 and the air scissor 109 can be moved together with the nozzle 107, maintaining the positional relationship with respect to the nozzle 107. The air chuck 108 and the air scissor 109 are not limited in shape, driving method, and the like as long as they can hold and cut the threadlike adhesive 2 at predetermined positions. In addition, instead of the air scissor 109, the threadlike adhesive 2 may be burned off by heat cutting using a heat cutter or the like.

In the threadlike adhesive sticking apparatus 101, the threadlike adhesive 2 supplied from the supply unit AU is pressed against the adherend by the nozzle 107, the springs 136 and 137, the lifting body of the horizontal moving unit 105, and the attachment plate 106. That is, the nozzle 107, the springs 136 and 137, the lifting body of the horizontal moving unit 105, and the attachment plate 106 function as the pressing mechanism BU.

(Operation of Threadlike Adhesive Sticking Apparatus 101 and Method for Sticking Threadlike Adhesive)

Using the threadlike adhesive sticking apparatus 101 configured as described above, an operator who sticks the threadlike adhesive 2 to an object first places the object on a stage. At the start of the operation, the threadlike adhesive 2 supplied from the winding body to the nozzle 107 is led out to the outside from the tip end 107d of the nozzle 107, and the operator presses the tip end into a predetermined position on the object. A relative position of the nozzle 107 with respect to the object is subjected to movement control by a control apparatus (movement control unit) (not shown) in accordance with a program set in advance. The program includes instructions such as a movement path, a movement speed, and a movement amount (a magnitude of a pressing force) in the Z direction of the nozzle 107 in the XY plane. When the movement of the nozzle 107 is started according to the program, the threadlike adhesive 2 is fed out from the winding body by an adhesive force of the threadlike adhesive 2 with respect to the object. The nozzle 107 presses the adhesive surface of the fed out adhesive surface 2, and the threadlike adhesive 2 is pressed against and stuck (press-bonded) to the object along a predetermined path while the nozzle 107 slides on the adhesive surface. After the sticking is completed, the threadlike adhesive 2 is cut at a predetermined position by the air chuck 108 and the air scissor 109.

FIG. 11 is a conceptual diagram illustrating a mode in which the nozzle 107 is moved on the object. Not only when the nozzle 107 goes straight as shown by an arrow L1, but also when a curve shown by an arrow L2 is extremely bent (bent at a steep angle), the threadlike adhesive sticking apparatus 101 can stick the threadlike adhesive 2 with high accuracy. In the threadlike adhesive sticking apparatus 101, the entire circumference (any positions in the peripheral portion) surrounding the tip end opening 107c in the tip end 107d of the nozzle 107 functions as a pressing portion configured to press the threadlike adhesive 2 against the object, and thus, the moving direction can be easily changed. Therefore, the threadlike adhesive sticking apparatus 101 can stick the threadlike adhesive 2 along a predetermined sticking path with high accuracy. The threadlike adhesive sticking apparatus 101 does not use a roller or the like as the pressing portion, and thus, this allows for preventing problems such as poor sticking accuracy due to the movement of the adhesive within the width of the roller when the adhesive is pressed by the roller, and detachment of the adhesive from the roller depending on the sticking path.

When the threadlike adhesive 2 is stuck to the object along a predetermined path, the threadlike adhesive sticking apparatus 101 (movement control unit) may press the nozzle 107 more strongly at a desired position, that is, increase a downward displacement amount of the nozzle attachment unit 106b in the Z-axis direction (approach the object). Even when the nozzle attachment unit 106b is momentarily lowered, it is possible to appropriately increase the force with which the nozzle 107 presses the threadlike adhesive 2 and to increase the adhesive force of the threadlike adhesive 2 at a desired position since the nozzle 107 is gently lowered by the springs 136 and 137 (absorption mechanism). In addition, the threadlike adhesive sticking apparatus 101 (movement control unit) may stop the movement in the XY plane (fix the position of the nozzle 107 with respect to the object) with the nozzle 107 maintained for several seconds at the desired position. Stopping a plane position of the nozzle 107 while pressing the nozzle 107 allows for increasing a pressing time of the threadlike adhesive 2 and to increase the adhesive force of the threadlike adhesive 2 at a desired position. When the threadlike adhesive 2 is stuck while being fed out from a winding body 120, the threadlike adhesive 2 is easily debonded at a start point (initial stage of sticking) of a predetermined path, a start point or an end point of a curve included in the predetermined path, a vertex of a corner included in the predetermined path. Therefore, lowering the nozzle 107 or stopping the nozzle 107 for several seconds with the nozzle 107 pressed at these positions allows for increasing the adhesive force of the threadlike adhesive 2 and preventing the debonding.

(Feeding-Out Assist Mechanism)

An example of providing the supply unit AU with a feeding-out assist mechanism will be described with reference to FIG. 12 to FIG. 17. The feeding-out assist mechanism is configured to apply an external force in a feeding direction to the threadlike adhesive 2 fed out from the winding body 120. Applying the external force in the feeding direction by the feeding-out assist mechanism allows for smoothly feeding out the threadlike adhesive 2 from the winding body 120 against a self-adhesion force between the threadlike adhesives 2 wound around the winding body 120 even when the threadlike adhesive does not have a release liner. Therefore, the threadlike adhesive 2 can be pressed against the object in a state where the tension of the threadlike adhesive 2 is reduced. Therefore, it is possible to prevent a problem that the threadlike adhesive 2 pressed against the object is debonded, cut, re-stuck, and entangled by tension, and to smoothly stick the threadlike adhesive 2.

Feeding-out assist mechanisms 150A, 150B, 150Ba, and 150C shown in FIG. 12 to FIG. 15 are provided in a path for conveying the threadlike adhesive 2 from the winding body 120 to the pressing mechanism BU, and the feeding-out assist mechanisms apply, to the threadlike adhesive 2, tensile forces (arrows F1 to F3) for pulling the threadlike adhesive 2 sandwiched therebetween in the feeding direction.

The feeding-out assist mechanism 150A shown in FIG. 12 includes a roller 151 (first roller), a roller 152 (second roller), a spring 153 (elastic body), and a spring attachment portion 154. The roller 151 is a feed out roller that is driven and rotated by a motor (not shown). The roller 152 sandwiches the threadlike adhesive 2 with the roller 151, is rotated in conjunction with the rotation of the roller 151, and sandwiches and pulls out the threadlike adhesive 2 in a direction of an arrow F1 (rotation direction). The spring 153 is attached between the roller 151 and the spring attachment portion 154, and the spring attachment portion 154 is fixed in the apparatus. The spring 153 can adjust the tensile force of the rollers 151 and 152. Further, controlling the rotation of the roller 151 allows for feeding out the threadlike adhesive 2 in accordance with a sticking distance (moving distance of the nozzle 107). The rollers 151 and 152 may be configured to be movable in the left-right direction (direction intersecting the direction of the arrow F1) without providing the spring 153.

The feeding-out assist mechanism 150B shown in FIG. 13 has a roller 155 (third roller), a roller 156 (fourth roller), and a roller 157 (fifth roller). The rollers 155 and 156 can chuck and release the threadlike adhesive 2 therebetween. The roller 157 is disposed between the winding body 120 and the rollers 155 and 156, and is displaceable so as to lengthen a path from the winding body 120 to the rollers 155 and 156 via the roller 157. When the roller 157 is displaced so as to lengthen this path, the threadlike adhesive 2 is pulled and fed out from the winding body 120 in a direction of an arrow F2. The fed out threadlike adhesive 2 is chucked by the rollers 155 and 156 and supplied to the pressing mechanism BU (nozzle 107). Then, when the chuck by the rollers 155 and 156 is released, the pressing mechanism BU presses the threadlike adhesive 2 against the object. While the chuck by the rollers 155 and 156 is released, the roller 157 returns to an original position. Controlling the displacement of the roller 157 allows for feeding out the threadlike adhesive 2 in accordance with the sticking distance (moving distance of the nozzle 107). In addition, when the threadlike adhesive 2 lacks during the sticking of the threadlike adhesive 2, the threadlike adhesive 2 can be chucked again by the rollers 155 and 156, and the roller 157 can be displaced to feed out the threadlike adhesive 2.

The feeding-out assist mechanism 150Ba shown in FIG. 14 has rollers 165, 166, 167, 168 and an arm 169. The roller 165 is a feed out roller that is driven and rotated by a motor (not shown). The roller 166 sandwiches the threadlike adhesive 2 with the roller 165, is rotated in conjunction with the rotation of the roller 165, and sandwiches and pulls out the threadlike adhesive 2 in a direction of an arrow F2a. The rollers 167 and 168 are provided between the rollers 165 and 166 and the pressing mechanism BU, and guide the threadlike adhesive 2 pulled out by the rollers 165 and 166 to the pressing mechanism BU. The arm 169 has one end to which the roller 167 is attached and the other end that is pivotally supported by a housing of the threadlike adhesive sticking apparatus 101 and to which a potentiometer for calculating the position of the roller 167 is attached. When the roller 167 is moved downward from a position shown in FIG. 14 (is displaced so as to lengthen a path from the rollers 165 and 166 to the roller 168), a conveying speed of the threadlike adhesive 2 decreases. In this way, the threadlike adhesive 2 is fed out by the rollers 165 and 166, and a rapid speed change of the fed out threadlike adhesive 2 can be alleviated by the displacement of the roller 167.

FIG. 15 shows an example in which the feeding-out assist mechanism 150C is provided in a threadlike adhesive sticking apparatus 101A in a mode of being gripped and used by an operator. Members having the same functions as those of the threadlike adhesive sticking apparatus 101 are denoted by the same reference numerals. The threadlike adhesive sticking apparatus 101A includes the supply unit AU (winding body 120) and the feeding-out assist mechanism 150C in a housing K1 having a size and a shape that can be held by one hand of an operator, and has a nozzle 107A at a tip end of the housing K1. The feeding-out assist mechanism 150C includes a roller 158 (first roller), a roller 159 (second roller), a spring 160 (elastic body), and a spring attachment portion 161. The roller 158 is exposed to the outside of the housing K1 from a portion of which a part is cut out in the housing K1, and is rotated by a finger M of the operator. The roller 159 sandwiches the threadlike adhesive 2 with the roller 158, is rotated in conjunction with the rotation of the roller 158, and sandwiches and pulls out the threadlike adhesive 2 in a direction of an arrow F3 (rotation direction). The spring 160 is attached between the roller 159 and the spring attachment portion 161, and the spring attachment portion 161 is fixed to an inner wall of the housing K1. A compression force (degree of collapse) to the threadlike adhesive 2 can be adjusted by the spring 160.

The threadlike adhesive 2 pulled and fed out by the feeding-out assist mechanism 150C is allowed to pass through the cylindrical internal space of the nozzle 107A at the tip end of the housing K1 with low tension, and is led out to the outside of the housing K1. The nozzle 107A is formed of the same material as that of the nozzle 107, and a tip end opening thereof has a circular shape or a polygonal shape having five or more corners. In addition, the nozzle 107A presses the threadlike adhesive 2, which has been allowed to pass through the cylindrical internal space and has been led out to the outside, against the object at the entire circumference or at any positions of the peripheral portion surrounding the tip end opening. That is, the operator holding the housing K1 can stick the threadlike adhesive 2 to the object in any path by pressing the nozzle 107A against the object while rotating the roller 158 with the finger M using the threadlike adhesive sticking apparatus 101A, just like operating a writing instrument such as a pen.

Feeding-out assist mechanisms 150D and 150E shown in FIG. 16 and FIG. 17 apply, to the threadlike adhesive 2, an extrusion force for feeding out the threadlike adhesive 2 by rotating the winding body 120 in the feeding direction.

The feeding-out assist mechanism 150D shown in FIG. 16 includes a surface drive SD and winding body holding rods 162, and holds the winding body 120 in place of the winding body holding unit of the threadlike adhesive sticking apparatus 101. The surface drive SD comes into contact with the threadlike adhesive 2 wound around the winding body 120 or the outer peripheral surface of the winding body 120, and rotatably holds the winding body 120. The surface drive SD is rotationally driven by a motor (not shown) to rotate the winding body 120 in the feeding direction indicated by an arrow F4. The winding body holding rods 162 are disposed on both end sides of the winding body 120, and hold the winding body 120 held by the surface drive SD so as to be rotatable and prevent the winding body 120 from falling off from the surface drive SD. The threadlike adhesive 2 is supplied to the pressing mechanism BU at a low tension by the feeding-out assist mechanism 150D that applies an extrusion force to the threadlike adhesive 2 by rotating the winding body 120.

FIG. 17 illustrates an example in which the feeding-out assist mechanism 150E is provided in a threadlike adhesive sticking apparatus 101B in a mode of being gripped and used by an operator. Members having the same functions as those of the threadlike adhesive sticking apparatus 101 are denoted by the same reference numerals. The threadlike adhesive sticking apparatus 101B includes the supply unit AU (winding body 120) and the feeding-out assist mechanism 150E in a housing K2 having a size and a shape that can be held by one hand of an operator, and has a nozzle 107B at a tip end of the housing K2. The feeding-out assist mechanism 150E has a gear 163 and a roller 164. The gear 163 is attached to the supply unit AU (winding body 120) and rotated together with the winding body 120. The gear 163 is exposed to the outside of the housing K2 from a portion K21 of which a part is cut out in the housing K2, and is rotated by a finger M of the operator. When the gear 163 is rotated by the finger M, an extrusion force is applied to the threadlike adhesive 2.

The extruded threadlike adhesive 2 is guided by the roller 164 to reach the nozzle 107B, is allowed to pass through the cylindrical internal space of the nozzle 107B with low tension, and is led out to the outside of the housing K2. The nozzle 107B has the same configuration as the nozzle 107A. The nozzle 107B presses the threadlike adhesive 2, which has been allowed to pass through the cylindrical internal space and has been led out to the outside, against the object at the entire circumference or at any positions of the peripheral portion surrounding the tip end opening. Therefore, the operator holding the housing K2 can draw any path by pressing the nozzle 107B against the object, rotating the gear 163 with the finger M. Therefore, the operator can stick the threadlike adhesive 2 to the object in any path (in various shapes) using the threadlike adhesive sticking apparatus 101B, just like operating a writing instrument such as a pen. Instead of the feeding-out assist mechanism 150E shown in FIG. 17, the movement of the nozzle 107B (pressing of the threadlike adhesive 2 by the nozzle 107) may be transmitted to a core (rotation shaft) of the winding body 120 by a belt formed of rubber or the like to assist the feeding out of the threadlike adhesive 2. In addition, the feeding out of the threadlike adhesive 2 may be assisted by directly rotating the core of the winding body 120.

Preferably, there is no member such as a roller for applying tension to the threadlike adhesive 2, in a path for conveying the threadlike adhesive 2 between the feeding-out assist mechanisms 150A, 150B, 150Ba, 150C, 150D, and 150E, the pressing mechanism BU (nozzle 107), and the nozzles 107A and 107B. In addition, in the threadlike adhesive sticking apparatus 101, a tension detector may be provided in a path for conveying the threadlike adhesive 2, and the feeding-out assist mechanisms 150A, 150B, and 150D may be controlled according to a detected tension value to feed out the threadlike adhesive 2 so as to have a constant tension. Further, in the above embodiment, an example of sticking the threadlike adhesive 2 to the adherend placed on the stage is shown, but the threadlike adhesive 2 can be stuck to an adherend having a three-dimensional shape such as a curved surface by attaching the nozzle 107 to an articulated robot arm having a degree of freedom of six axes, for example.

Second Embodiment

FIG. 18 is a schematic view illustrating a threadlike adhesive sticking apparatus according to a second embodiment of the present invention. As shown in FIG. 18, a threadlike adhesive sticking apparatus 100 of the present embodiment includes a main body 1 having a shaft shape, and a tip end portion 4 detachably provided at one end of the main body 1. The main body 1 is provided with a grip 3 formed of a resin or the like.

An operator grips the threadlike adhesive sticking apparatus 100 at the portion of the grip 3, presses the tip end portion 4 against an object, which is an adherend of the threadlike adhesive 2, and moves the tip end portion 4 in one direction, whereby the threadlike adhesive 2 can be fed out. That is, the operator can use the threadlike adhesive sticking apparatus 100, just like operating a writing instrument such as a pen, gripping (grip 3 of) the elongated main body 1 having a shaft shape. For example, the operator can operate the threadlike adhesive sticking apparatus 100 as expected even in a narrow location or the like with many obstacles, and can efficiently perform various operations.

The main body 1 has a shaft shape extending in a uniaxial direction. An internal space S having a shaft shape is defined inside the main body 1 as shown in FIG. 18. The tip end portion 4 having a tapered shape is detachably attached to one end (tip end) of the main body 1. A shape of the tip end portion 4 may be a shape having a cylindrical pipe at the tip of the tapered shape, like a tip of a mechanical pencil. A tip end opening 4a is formed at the tip end of the tip end portion 4, and the internal space S of the main body 1 communicates with the outside through the tip end opening 4a (tubular internal space). The tip end portion 4 is defined by a region from a position P1 (FIG. 18) where a cross-sectional area thereof is smaller than that of the main body 1, to the tip end opening 4a. At the other end (rear end) of the main body 1, a winding body capable of winding the threadlike adhesive 2 is attached inside.

In the present embodiment, the tip end portion 4 has a tapered shape of which a cross section becomes smaller toward the tip end, and this improves workability in a narrow location. In addition, when the tip end portion 4 has a cylindrical pipe at the tip of the tapered shape, as the pipe is thinner and longer, workability in a narrower location is improved. The parts (a) and (b) of FIG. 19 are views illustrating an example of the cross-section of the tip end portion 4 as viewed from a tip end opening 4a side. The part (a) of FIG. 19 shows the tip end portion 4 having a circular cross-section and the part (b) of FIG. 19 shows the tip end portion 4 having a pentagonal cross-section. Portions of the peripheral portion of the tip end opening 4a having a circular cross-sectional shape or a polygonal cross-sectional shape having five or more sides function as the pressing portion, and thus, the sticking direction can be easily changed. An overall shape of the tip end portion 4 is not limited, but examples thereof include a conical shape, a quadrangular pyramid shape, and a fountain pen tip shape (saucer shape). The overall shape of the tip end portion 4 may be an extremely elongated straw shape.

A length of the tip end portion 4 shown in FIG. 18 is preferably 3 mm or more, and more preferably 10 mm or more. A width W of the tip end portion 4 shown in the parts (a) and (b) of FIG. 19 is defined by a position where the cross-sectional area of the tip end portion 4 is the smallest, but the width W also corresponds to an inner diameter (diameter) of the tip end portion 4. The minimum cross-sectional area of the tip end portion 4 is preferably in a range of 1.2 to 9 times the cross-sectional area of the threadlike adhesive 2. Thus, for example, when the cross-section of the threadlike adhesive 2 has a circular shape having a diameter of 0.3 mm, the size of the width W of the tip end portion 4 is set in a range of about 0.32 mm to 0.9 mm. Such a size is expected to improve workability. In addition, in the threadlike adhesive sticking apparatus 100, the unnecessary movement of the threadlike adhesive 2 is restricted by the tip end opening 4a of the tip end portion 4. Therefore, without using a roller or the like as the pressing portion, the operator can grip the threadlike adhesive sticking apparatus 100 at the portion of the grip 3 and stick the threadlike adhesive 2, moving the tip end portion 4 in any directions. Accordingly, this prevents a problem in the case of pressing the adhesive by the roller, that the adhesion accuracy is poor due to the movement of the adhesive within a roller width, and the adhesive is detached from the roller depending on an adhesion path. Further, when the tip end portion 4 has a cylindrical pipe at the tip of the tapered shape, as the pipe is thinner and longer, workability in a narrower location is improved.

Third Embodiment

FIG. 20 is a perspective view illustrating an internal structure of a threadlike adhesive sticking apparatus 100 according to a third embodiment. In the present embodiment, at the other end (rear end) of the main body 1, a winding body 5 capable of winding the threadlike adhesive 2 is rotatably attached in a direction perpendicular to an axial direction of the main body 1 as an axis. Since the threadlike adhesive 2 is allowed to pass through the internal space S and goes out from the tip end opening 4a, unnecessary movement is restricted. Further, portions of the peripheral portion of the tip end opening 4a function as the pressing portion, and thus, a sticking direction can be easily changed.

Fourth Embodiment

FIG. 21 is a schematic front view illustrating a main part of a threadlike adhesive sticking apparatus 200 according to a fourth embodiment. The threadlike adhesive sticking apparatus 200 is different from the threadlike adhesive sticking apparatus 101 according to the first embodiment in configurations of the pressing mechanism BU and the conveyance unit CU and a configuration for reducing an extra length of the threadlike adhesive 2 at the time of cutting. Hereinafter, differences from the first embodiment will be mainly described, and redundant description will be omitted.

In the threadlike adhesive sticking apparatus 200, main parts of the pressing mechanism BU and the conveyance unit CU are attached to front of an attachment plate 201 having a substantially rectangular shape, and are positioned by the positioning unit DU.

(Conveyance Unit CU of Threadlike Adhesive Sticking Apparatus 200)

The threadlike adhesive sticking apparatus 200 includes a roller 122 (see FIG. 5), rollers 202, 203, and 204, a moving unit 205, an arm 206, rollers 207, 208, and 209, a moving unit 210, a roller 211, and a moving unit 212 as an example of the conveyance unit CU, and conveys the threadlike adhesive 2 fed out from the supply unit AU (winding body) to the nozzle 107.

The rollers 202, 203, 204, 207, 208, 209, and 211 are configured similarly to the above-described roller 122 and the like, and are rotatably attached to the attachment plate 201 directly or indirectly, in a perpendicular plane (YZ plane). As an example, the rollers 202, 203, 204, 207, 208, 209, and 211 are disposed such that respective rotation positions are at substantially the same distance from the front surface side of the attachment plate 201 (front side of the paper surface in FIG. 21).

The roller 202 is attached to an upper left corner of the attachment plate 201, and guides the threadlike adhesive 2 to the rollers 203 and 204. On the left side of the roller 202 and on the right side of the roller 122 in the frame erected on the left side of the winding body holding unit 121, a roller capable of being moved up and down according to the tension of the threadlike adhesive 2 to be conveyed and a roller provided on the upper right side of the roller (both not shown) may be disposed. The tension of the threadlike adhesive 2 supplied to the roller 202 can be adjusted to be constant by these rollers.

The roller 203 is attached to the attachment plate 201 slightly below the right side of the roller 202. The roller 203 is a feed out roller that is driven and rotated by a motor (not shown).

The roller 204 is disposed on the upper right of the roller 203, and is attached to a lower left end portion of the moving unit 205 such as an air cylinder that is moved (slides) in a direction of an arrow D1 (upper right and lower left directions) with respect to the attachment plate 201. When the roller 204 is located at the lowest left, the roller 204 is rotated in conjunction with the rotation of the roller 203, sandwiches the threadlike adhesive 2 with the roller 203, and pulls out the threadlike adhesive 2 in a direction of an arrow F5.

The arm 206 is a rod-shaped body extending in the left-right direction below the rollers 202 and 203 and the moving unit 205. The roller 207 is attached to the right end portion of the arm 206. A vicinity of the left end portion of the arm 206 is rotatably supported to the attachment plate 201 by a rotation shaft 206a. A potentiometer for calculating a position of the roller 207 is attached to the rotation shaft 206a. The arm 206 is rotated in a direction of an arrow D2 (substantially in up-down direction) by a drive unit such as a motor provided on the rear side of the attachment plate 201, for example. That is, the roller 207 is movable in the up-down direction by the rotation of the arm 206.

A shaft 206b that extends along an extending direction of the arm 206 and is provided with a spiral ridge on the outer peripheral surface thereof, protrudes from the left end portion of the arm 206. One or more weights 206c are attached to the shaft 206b. The weight 206c has a substantially disc shape, and a through hole provided at the center of the weight 206c is formed with a groove to be screwed with the ridge of the shaft 206b. The ease of movement of the arm 206 can be controlled by changing a distance between the weight 206c and the rotation shaft 206a (left end portion of the arm 206) by shifting the position of the weight 206c on the shaft 206b.

The roller 208 is attached to the upper right of the roller 207 and the right side of the roller 204 in the attachment plate 201. The roller 208 guides the threadlike adhesive 2 pulled out by the rollers 203 and 204 to, via the roller 207, the pressing mechanism BU (nozzle 107) provided directly below the roller 208.

When the roller 207 is moved downward (displaced so as to lengthen a path from the rollers 203 and 204 to the roller 208), a conveying speed of the threadlike adhesive 2 decreases. In this way, the threadlike adhesive 2 is fed out by the rollers 203 and 204, and a rapid speed change of the fed threadlike adhesive 2 can be alleviated by the displacement of the roller 207. That is, the rollers 203, 204, 207, and 208 and the arm 206 function as the feeding-out assist mechanism 150Ba shown in FIG. 14.

(Reduction of Extra Length in Threadlike Adhesive Sticking Apparatus 200)

On the right side of the roller 208, i.e., above the nozzle 107, a roller 209 attached to a left end portion of the moving unit 210 that is moved in a direction of an arrow D3 (left-right direction) with respect to the attachment plate 201 is disposed. The roller 209 is disposed adjacent to the roller 208 so that the threadlike adhesive 2 can be nipped between the roller 209 and the roller 208 when the roller 209 is positioned at the leftmost position. The roller 209 provided upstream of the nozzle 107 nips (chucks) the threadlike adhesive 2 with the roller 208 when the sticking of the threadlike adhesive 2 is completed and the nozzle 107 is raised. In this state, the threadlike adhesive 2 is cut at a position close to an adherend H.

In the first embodiment, the threadlike adhesive 2 is chucked below (downstream of) the nozzle 107 by the air chuck 108, whereas in the present embodiment, the roller 209 is provided upstream of the nozzle 107 and chucks the threadlike adhesive 2 with the roller 208 that conveys the threadlike adhesive 2. With this configuration, since a space for the air chuck 108 below the nozzle 107 can be reduced, an extra length at the time of cutting (end point) can be reduced.

The roller 211 is disposed below the rollers 208 and 209 and the moving unit 210, that is, above the nozzle 107, and is attached to the left end portion of the moving unit 212 that is moved in a direction of an arrow D4 (left-right direction)

with respect to the attachment plate 201. As an example, when the roller 211 is positioned on the right side, the roller 211 allows the threadlike adhesive 2 to pass through and guides the threadlike adhesive 2 into the nozzle 107, and when the threadlike adhesive 2 is cut, the roller 211 is moved to the left side to press the threadlike adhesive 2 in a left direction, and moves the cut tip end portion (lower end portion) of the threadlike adhesive 2 upward. Raising the lower end portion of the threadlike adhesive 2 after cutting the threadlike adhesive 2 allows for reducing the extra length at the start of the next sticking of the threadlike adhesive 2 (start point). When the threadlike adhesive 2 is allowed to pass through the right side of the roller 211, the roller 211 is moved to the right side to pull the threadlike adhesive 2 in a right direction, so that the lower end portion of the threadlike adhesive 2 can be moved upward.

The extra length of the threadlike adhesive 2 may be reduced by rotating the roller 203 or the like in a reverse direction. However, it is concerned that this may cause a problem that the threadlike adhesive 2 may be wound around the roller 203 or the like and may not be wound around the winding body due to the reverse rotation. In this regard, as described above, nipping and cutting the threadlike adhesive 2 by using the rollers 208 and 209 and then raising the lower end portion of the threadlike adhesive 2 by the roller 211 allow for reducing the extra length of the end point and the start point without the above-described problem.

A guide rod (not shown) erected on the front of the attachment plate 201 may be provided below the roller 211. A surface (outer peripheral surface) of the guide rod is a non-adhesive surface, and thus the guide rod allows for restricting the displacement of the threadlike adhesive 2 in the left direction.

(Pressing Mechanism BU of Threadlike Adhesive Sticking Apparatus 200)

The threadlike adhesive sticking apparatus 200 includes the nozzle 107, a slider 213, a fixing unit 214, and a spring 215 as an example of the pressing mechanism BU, and sticks the threadlike adhesive 2 conveyed to the conveyance unit CU to the adherend H. The pressing mechanism BU is provided below the roller 211 and the moving unit 212 on the attachment plate 201.

The nozzle 107 is fixed to the front of the slider 213, and the tip end opening 107c can protrude from the lower end of the attachment plate 201. The slider 213 is movable in the up-down direction with respect to the attachment plate 201 by a linear guide or the like.

In the attachment plate 201, the fixing unit 214 is fixed above the slider 213. The fixing unit 214 holds the spring 215, with a shaft inserted therein, with the upper surface of the slider 213.

As described above, as in the first embodiment, the nozzle 107 of the present embodiment includes an absorption mechanism that is movable in the up-down direction and configured to absorb a displacement of the nozzle 107 with respect to a displacement of a base to which the nozzle 107 is attached in the up-down direction.

Further, the air scissor 109 (nipper) is disposed on the right side of the pressing mechanism BU in the attachment plate 201. The air scissor 109 is moved obliquely to the lower left from a normal position by a driving unit, and cut the threadlike adhesive 2 directly below the nozzle 107. At this time, as described above, since the threadlike adhesive 2 is chucked above the nozzle 107 (with the rollers 208 and 209), the air chuck 108 is unnecessary. Therefore, a distance between the nozzle tip end 107c and the threadlike adhesive 2 attached to the adherend H can be reduced, and the extra length at the time of cutting (end point) can be reduced.

(Improvement of Sticking with Short Extra Length)

The movement of the nozzle 107 in the sticking start point creation when the extra length is short will be described with reference to FIG. 22 and FIG. 23. When the extra length is short at the start of sticking of the threadlike adhesive 2, as shown in PHASE 2 of FIG. 22, the threadlike adhesive 2 may enter the inside of the nozzle 107, and the start point may not be attached to the adherend H when the nozzle 107 is vertically lowered in a direction of an arrow N1 shown in PHASE 1 of FIG. 22. Therefore, when the nozzle 107 is lowered in an oblique direction (direction of an arrow N2) from the state shown in PHASE 1 of FIG. 23, the start point can be created without allowing the threadlike adhesive 2 to enter the nozzle 107, as shown in PHASE 2 of FIG. 23.

As described above, the threadlike adhesive sticking apparatus 200 includes the feeding-out assist mechanism (the rollers 203, 204, 207, and 208 and the arm 206) and the configuration for reducing the extra length (the rollers 208 and 209 that chuck the threadlike adhesive 2 upstream of the nozzle 107, and the roller 211 that presses/pulls the cut threadlike adhesive 2 upstream of the nozzle 107). This configuration, in addition to the same effect as that of the first embodiment, allows for conveying the threadlike adhesive 2 at a low tension and reducing the extra length at the start and end of sticking. Therefore, the threadlike adhesive 2 can be stuck at high speed without waste.

Fifth Embodiment

FIG. 24 is a perspective view illustrating a threadlike adhesive sticking apparatus 200A according to a fifth embodiment. FIG. 25 is a front view illustrating a state where an opening/closing frame 235 is opened in the threadlike adhesive application device 200A according to the fifth embodiment. The threadlike adhesive sticking apparatus 200A mainly includes a main body frame 230, a gripping portion 231, and an opening/closing frame 235 in which a winding body 240 capable of winding the threadlike adhesive 2 is held.

In the main body frame 230, a lower portion of an elongated plate member extending in the up-down direction is bent in an oblique direction to be tapered. The nozzle 107 is fixed to the bent portion of the main body frame 230, and a pressing roller 232 is provided at the tapered lower end. As shown in FIG. 25, the nozzle 107 is attached along an axial direction of the main body frame 230. In addition, the pressing roller 232 is disposed at a position slightly above the tip end opening 107c on the front side of the tip end opening 107c of the nozzle 107. The pressing roller 232 is rotatably attached to the main body frame 230 in a vertical plane. The function of the pressing roller 232 will be described later.

A motor 233 and a roller 234 driven by the motor 233 are attached to substantially the center of the main body frame 230. The roller 234 is rotatably attached to the opening/closing frame 235 in the vertical plane, and sandwiches the threadlike adhesive 2 with a roller 236 rolling in accordance with the rotation of the roller 234 to feed out the threadlike adhesive 2 from the winding body 240. That is, the rollers 234 and 236 function as a feeding-out assist mechanism. The motor is provided with a speed volume (not shown) for adjusting a rotation speed of the motor 233, that is, for manually adjusting a feed-out speed of the threadlike adhesive 2.

The gripping portion 231 having a substantially rectangular plate shape is provided slightly below the center of the main body frame 230 so as to protrude rearward. The gripping portion 231 is gripped by an operator. The gripping portion 231 is provided with a switch 231A for switching on/off of the motor 233 to start/stop feed out of the threadlike adhesive 2. As an example, the switch 231A is provided at a position where the operator can easily operate the switch 231A with an index finger in a state where the operator grips the gripping portion 231, the switch 231A turns on the motor 233 while the switch 231A is pressed and turns off the motor 233 when the switch 231A is released from the pressing (that is, when the switch 231A is not pressed).

The opening/closing frame 235 includes a roller holding unit 237 configured to rotatably hold the roller 236 in the vertical plane, and a winding body holding unit 238 configured to rotatably hold the winding body 240 in the perpendicular plane. The opening/closing frame 235 is pivotally supported by the main body frame 230 at the rear of the lower end side, and can be opened and closed with respect to the main body frame 230.

In an open state shown in FIG. 25, the operator sets the winding body 240 in the winding body holding unit 238, and inserts the threadlike adhesive 2 into the inside of the nozzle 107 via the rotation surface of the roller 236. Then, the operator rotates the opening/closing frame 235, on which the winding body 240 is set, rearward to close the opening/closing frame 235, and engages the upper end of the opening/closing frame 235 with the main body frame 230 to bring the opening/closing frame 235 into a closed state shown in FIG. 24.

As shown in FIG. 24, the operator grasps the gripping portion 231 to bring the tip end (tip end opening 107c) of the nozzle 107 close to the adherend. At this time, when the extra length of the threadlike adhesive 2 is short, the operator lowers the nozzle 107 in an oblique direction as shown in FIG. 23, so that the start point can be reliably created without allowing the threadlike adhesive 2 to enter the nozzle.

When the operator operates the switch 231A, the motor 233 is rotated, and the rollers 234 and 236 feed out the threadlike adhesive 2 from the winding body 240 by the rotation of the motor 233. When the operator moves the nozzle 107 on the adherend in any direction, the threadlike adhesive 2 fed out from the winding body 240 is stuck to the adherend in any path.

FIG. 26 shows a state where the threadlike adhesive 2 is cut at the end of the sticking operation using the threadlike adhesive sticking apparatus 200A. When the sticking operation ends, the operator operates (releases the pressing of) the switch 231A to stop the rotation of the motor 233. At an end point position, as shown in FIG. 26, the operator tilts the main body frame 230 with respect to a vertical direction, and presses the threadlike adhesive 2 against the adherend by the pressing roller 232. Pressing the threadlike adhesive 2 with the pressing roller 232 allows for preventing a stuck portion (end point of the threadlike adhesive 2) from being lifted and debonded.

The operator cuts the threadlike adhesive 2 in the vicinity of the end point with a scissor 241 in a state where the end point is pressed by the pressing roller 232 as described above. Since the pressing roller 232 is provided in the vicinity of the nozzle 107, the operator can prevent debonding of the end point of the threadlike adhesive 2 by a simple operation of merely gripping and tilting the threadlike adhesive attaching device 200A (main body frame 230).

As described above, the threadlike adhesive sticking apparatus 200A of the present embodiment allows for easily changing the sticking direction since a plurality of portions of the peripheral portion of the tip end opening 107c of the nozzle 107 function as the pressing portion, similarly to the second embodiment, though the workability in a narrow location is better in the threadlike adhesive sticking apparatus 100 of the second embodiment. Therefore, the operator can stick the threadlike adhesive 2, gripping the gripping portion 231 and moving the threadlike adhesive 2 in any direction.

Sixth Embodiment

FIG. 27 is a schematic view illustrating a threadlike adhesive sticking apparatus 200B according to a sixth embodiment. The threadlike adhesive sticking apparatus 200B includes an attachment plate 250, rollers 251 and 252 provided on the attachment plate 250, and the nozzle 107. A winding body 260 capable of winding the threadlike adhesive 2 is rotatably held by the attachment plate 250 in a vertical plane. The threadlike adhesive sticking apparatus 200B is a stationary sticking apparatus in which, for example, the attachment plate 250 is fixedly disposed and used on a table with a support frame.

The rollers 251 and 252 are disposed on a side (right side in FIG. 27) of the winding body 260 on the front surface side of the attachment plate 250. The roller 251 is driven by a motor provided on the rear side of the attachment plate 250. The roller 252 sandwiches the threadlike adhesive 2 with the roller 251, and is rotated with the rotation of the roller 251. The rotation of the rollers 251 and 252 causes the threadlike adhesive 2 to be fed out from the winding body 260. The nozzle 107 is fixed below (directly below) the rollers 251 and 252 at the lower end of the attachment plate 250.

The operator drives the motor to feed out the threadlike adhesive 2, brings the adherend H into contact with the tip end opening 107c of the nozzle 107, and sticks the threadlike adhesive 2 in any path, moving the adherend H. At the end of the sticking, the driving of the motor is stopped, and the threadlike adhesive 2 is cut by a scissor or the like.

As described above, according to the threadlike adhesive sticking apparatus 200B according to the sixth embodiment, the operator can stick the threadlike adhesive 2 to the adherend H having a planar or three-dimensional shape in any path by gripping the adherend H and moving the adherend H with the adherend H brought into contact with the tip end opening 107c of the nozzle 107.

(Details of Threadlike Adhesive 2)

FIG. 28 shows a schematic view of the threadlike adhesive 2 used in the threadlike adhesive sticking apparatuses 100, 101 and the like according to the first to sixth embodiments. The threadlike adhesive 2 includes a linear adhesive body including a linear core material 2a and an adhesive layer 2b that covers a surface of the core material 2a in a longitudinal direction.

The threadlike adhesive 2 is an elongated adhesive body and has a linear shape. The linear shape mentioned here is a concept including not only a straight line shape, a curved line shape, a polygonal line shape, and the like, but also a state in which a material can be bent in various directions and angles like a filament (i.e., threadlike). In addition, the adhesive layer in the present specification also includes a linear adhesive layer.

A cross-sectional shape of the threadlike adhesive 2 in the present configuration example is a circular shape, though the present embodiment is not limited to a specific shape. The cross-sectional shape may be an elliptical shape, a rectangular shape such as a quadrangular shape, or the like, in addition to the circular shape.

The adhesive layer 2b contains an adhesive formed of an adhesive composition. The adhesive is not limited, and a known adhesive can be used. Examples of the adhesive include an acrylic-based adhesive, a rubber-based adhesive, a vinyl alkyl ether-based adhesive, a silicone-based adhesive, a polyester-based adhesive, a polyamide-based adhesive, a urethane-based adhesive, a fluorine-based adhesive, and an epoxy-based adhesive. Among these adhesives, an acrylic-based adhesive, a urethane-based adhesive, a silicone-based adhesive, a rubber-based adhesive, or a polyester-based adhesive is preferable, and an acrylic adhesive is particularly preferable from the viewpoint of adhesiveness. The adhesive may be used alone or in combination of two or more kinds thereof. The adhesive in this embodiment is preferably a pressure-sensitive adhesive, which has adhesiveness at room temperatures and can be stuck to a surface of an adherend by a pressure generated when a surface of the adhesive and the surface of the adherend are brought into contact with each other. When the adhesive is a pressure-sensitive adhesive, the adhesive does not need to be heated and can be applied to an adherend that is sensitive to heat.

As the adhesive, either a solvent-type adhesive or a water-dispersible type adhesive can be used. The adhesive is preferably an adhesive obtained by performing crosslinking by drying (solvent volatilization) an adhesive composition and rapidly completing the crosslinking after drying. This is because new crosslinking is avoided to increase after surfaces of adhesive layers come into contact with one another. Here, a water-dispersible type adhesive is preferable and a water-dispersible type acrylic adhesive is more preferable, as such an adhesive enables high-speedily coating, is friendly to the environment, and has a small influence on a base material or a core material (swelling or dissolution).

In the adhesive body having a core material, an adhesive layer may cover the entire surface of the core material (a surface in a longitudinal direction), or may cover at least a part of the surface of the core material. Though an adhesive layer is typically formed to be continuous, the adhesive layer is not limited to such a form, and may be formed in a regular or random pattern such as a dot pattern or a stripe pattern. An end surface of the core material may or may not be covered with an adhesive layer. For example, when the adhesive body is cut during a producing process or during use, the end surface of the core material may not be covered with the adhesive layer.

As the core material used in the threadlike adhesive 2, for example, a resin, a rubber, a foam, an inorganic fiber, a composite thereof, or the like can be used. Examples of the resin include: polyolefins such as polyethylene (PE), polypropylene (PP), an ethylene-propylene copolymer, and an ethylene-vinyl acetate copolymer; polyesters such as polyethylene terephthalate (PET); a vinyl chloride resin; a vinyl acetate resin; a polyimide resin; a polyamide resin; and a fluorine-based resin. Examples of the rubber include a natural rubber, and a synthetic rubber such as a urethane rubber. Examples of the foam include a foamed polyurethane and a foamed polychloroprene rubber. Examples of the fiber include a glass fiber, a carbon fiber, a metal fiber, a chemical fiber (a regenerated fiber, a semi-synthetic fiber, a synthetic fiber, etc.), and a natural fiber (a plant fiber, an animal fiber, etc.). A cross-sectional shape of the core material is not limited, and is usually a cross-sectional shape corresponding to a cross-sectional shape of the adhesive body.

Examples of a material of the threadlike core material that can be used in the threadlike adhesive 2 include various polymer materials such as rayon, cupra, acetate, promix, nylon, aramid, vinylon, vinylidene, polyvinyl chloride, polyester, acrylic, polyethylene, polypropylene, polyurethane, polyclal, and polylactic acid; glass, carbon fiber, various rubbers such as natural rubber and synthetic rubber such as polyurethane; natural materials such as cotton and wool; and metal. A form of the threadlike core material may be a monofilament, a multifilament, a spun yarn, a processed yarn, which has been subjected to crimping or bulking and called a textured yarn, a bulky yarn, and a stretch yarn, or combined yarns obtained by twisting them together, or the like. The cross-sectional shape is not limited to only a circle, and may be a rectangular shape such as a square shape, a star shape, an elliptical shape, a hollow shape, and the like.

The core material may contain various additives such as a filler (an inorganic filler, an organic filler, etc.), an anti-aging agent, an antioxidant, an ultraviolet absorber, an antistatic agent, a lubricant, a plasticizer, and a colorant (a pigment, a dye, etc.) as necessary. A known or common surface treatment such as a corona discharge treatment, a plasma treatment or application of an undercoat agent may be performed on the surface of the core material.

A size of a cross-section of the core material is not limited and may be appropriately selected depending on a purpose. For example, when the cross-sectional shape of the core material is a circular shape, a diameter of the cross-sectional shape of the core material is preferably 1 µm to 2000 µm, and more preferably 10 µm to 1000 µm from the viewpoint of handleability (flexibility, difficulty in cutting).

A thickness of the adhesive layer is not limited, but is, for example, preferably 1 µm or more, and more preferably 3 µm or more from the viewpoint of adhesiveness. The thickness of the adhesive layer is, for example, preferably 200 µm or less, and more preferably 150 µm or less from the viewpoint of thickness unevenness and drying properties. Further, the thickness can be increased by stacking layers according to an application.

In particular, the threadlike adhesive 2 is preferably a pressure-sensitive adhesive body in which the adhesive forming the adhesive layer 2b has adhesiveness at room temperature and that can be stuck to a surface of an adherend by a pressure generated when a surface of the adhesive and the surface of the adherend are brought into contact with each other. When the adhesive body is a pressure-sensitive adhesive body, the adhesive body does not need to be heated and can be applied to an adherend that is sensitive to heat.

As described above, the shape of the threadlike adhesive 2 is not limited. The larger ratio (major axis/minor axis) of a length of the major axis (the longest axis that passes through the center of gravity of the cross-sectional shape) to a length of the minor axis (the shortest axis that passes through the center of gravity of the cross-sectional shape) of the cross-sectional shape of the threadlike adhesive 2 equates to the flatter shape of the threadlike adhesive 2. On the other hand, as the ratio becomes smaller, the cross-sectional shape of the threadlike adhesive 2 comes close to a circular shape. When the cross-sectional shape of the threadlike adhesive 2 is a circular shape, the ratio has a minimum value of 1. When the minimum value is 1, the cross-sectional shape of the threadlike adhesive 2 also includes a special shape such as a triangle and a star shape.

The threadlike adhesive 2 may have a release liner. When the threadlike adhesive 2 has a release liner, the release liner is debonded from the adhesive layer before the threadlike adhesive 2 reaches the nozzle 107 or the like, and the adhesive body is stuck to the object. The threadlike adhesive 2 has the release liner, and thus, the self-adhesion force of the adhesive can be reduced, and the threadlike adhesive 2 can be pressed against an object in a state where the tension of the threadlike adhesive 2 is reduced. Therefore, the release liner allows for preventing a problem that the threadlike adhesive 2 pressed against the object is debonded, cut, re-stuck, and entangled by tension, and allows for smoothly sticking of the threadlike adhesive 2.

Embodiments and usage methods of the threadlike adhesive 2 are roughly classified into the following four patterns. Here, a non-adhesive layer is a layer that covers a surface (a surface in the longitudinal direction) of the adhesive body, and the non-adhesive layer includes, for example, a layer that covers the adhesive body in an initial state before stretching and is cut out by stretching the adhesive body to exhibit adhesiveness of the adhesive body. A type, a material, and the like of the non-adhesive layer are not limited.

1) An adhesive body without a non-adhesive layer is directly press-bonded.
2) An adhesive body without a non-adhesive layer+a release liner (the release liner is debonded before press-bonding)
3) An adhesive body covered with a non-adhesive layer
4) An adhesive body covered with a non-adhesive layer+a release liner (the release liner is debonded before press-bonding)

Further, the threadlike adhesive 2 of the present embodiment has flexibility and has a filamentous shape that can be bent in various directions and angles like a yarn. The adhesive body having flexibility, in particular, an threadlike adhesive body, has an advantage in that the adhesive body can be easily applied to complicated shapes such as a curved line, a curved surface, and unevenness in addition to the effects described above.

For example, when an adhesive tape is stuck to an adherend having a part with a complicated shape such as a curved line, a curved surface, or an uneven shape, a wrinkle or overlapping may occur in the adhesive tape in such a part, and this makes it difficult to finely stick the adhesive tape and to prevent a protrusion. The part where a wrinkle or overlapping occurs may cause a decrease in the adhesive force. In order to prevent the occurrence of a wrinkle or overlapping and to stick the adhesive tape, the adhesive tape may be stuck while finely cutting the adhesive tape. However, this significantly deteriorates workability. On the other hand, an adhesive body having flexibility, in particular, a threadlike adhesive body can be firmly stuck without causing a wrinkle or overlapping even when the threadlike adhesive body is stuck to a part having a complicated shape such as a curved line, a curved surface, and an uneven shape. Further, such an adhesive body can be stuck to a part to be stuck at one time, that is, in one step, and thus, the adhesive body is excellent in workability and can be applied to an automation line.

Specific examples of an application of the threadlike adhesive body include an application to fix cables such as electric wires or optical fibers, optical fiber sensors such as LED fiber light and Fiber Bragg Gratings (FBG), various wire members (linear members) such as a yarn, a string, and a wire, and a narrow member, in a desired form. For example, even when a wire member or a narrow member is fixed to another member in a complicated shape, the threadlike adhesive body can be firmly fixed with excellent workability while preventing protrusion, wrinkles, and overlapping in accordance with the complicated shape of the wire member or the narrow member. When the wire member or the narrow member is fixed to another member, the threadlike adhesive body is stuck in advance in accordance with a form in which the wire member or the narrow member is to be fixed on a surface of the other member, and then, the wire member or the narrow member can be allowed to bond and fixed in accordance with the adhesive body stuck to the surface of another member. Alternatively, the threadlike adhesive body is stuck to a wire member or a narrow member, and then, the wire member or the narrow member may be fixed to another member in a desired form.

The threadlike adhesive body can also be suitably used for temporary fixing (temporary tacking) of an article, for temporarily fixing (temporarily tacking) one article to a surface of another article. More specifically, the threadlike adhesive body can be particularly suitably used for temporary fixing (temporary tacking) in producing, for example, fiber products and leather products such as clothes, shoes, bags, and hats. However, the application is not limited to this example, and the threadlike adhesive body is suitably used for various applications in which temporary fixing (temporary tacking) is desired.

For example, when one article is fixed to a surface of another article, the one article is temporarily fixed and positioned on the surface of another article in advance using the threadlike adhesive body, and then both articles are fixed (finally fixed) by a fixing method such as thermocompression bonding and sewing. In this case, the threadlike adhesive body easily and temporarily fixes the two articles without a fixing unit provided between the two articles. For example, in the case that a fiber product or a leather product is sewn, when temporary fixing is performed using the threadlike adhesive body, the temporary fixing can be easily performed, avoiding a part to be sewed, and the adhesive can be easily prevented from adhering to a needle.

In addition, the threadlike adhesive body can be well stuck with a protrusion, a wrinkle, and overlapping prevented even when shapes of two articles are a complicated shape such as a curved line, a curved surface, and an uneven shape. Further, the threadlike adhesive body can be stuck in one step, and workability is sufficient.

Even in the case of a member that is likely to be deformed, such as fabric, cloth, and leather, which forms a fiber product or a leather product, temporary fixing with the threadlike adhesive body allows for preventing deformation of the member due to tension to improve a design after fixing (final fixing).

Further, after two articles are fixed (finally fixed) using the threadlike adhesive body, the threadlike adhesive body can also be pulled out and removed if necessary from the two articles that are fixed (finally fixed). In this case, the adhesive can be prevented from protruding and from deterioration of a design due to aging discoloration of the remaining adhesive satisfactorily.

Furthermore, the threadlike adhesive body can be twisted with a yarn made of other material to form a composite yarn or can be woven with a yarn or cloth (including nonwoven fabric and sheet) made of other material to seek a function combination.

Further, the threadlike adhesive 2 stuck to the release liner (temporary support) can be transferred to the adherend by the threadlike adhesive sticking apparatus and the method for sticking threadlike adhesive of the present embodiment. The method will be described below.

First, the threadlike adhesive 2 is stuck to a temporary support in the form of a film or the like by the threadlike adhesive sticking apparatus and the method for sticking a threadlike adhesive of the present embodiment described above. In order to stuck the threadlike adhesive 2 to the adherend in a desired shape, the threadlike adhesive 2 is stuck (drawn) on the temporary support in a shape obtained by inverting the desired shape.

Next, the adhesive surface of the threadlike adhesive 2 stuck to the temporary support is brought into contact with the adherend, and the threadlike adhesive 2 is pressed and allowed to bond to the adherend through the temporary support by a roller, a finger, or the like.

Thereafter, the temporary support is debonded and removed from the threadlike adhesive 2 adhered to the adherend to expose the threadlike adhesive 2. In this way, the threadlike adhesive 2 is stuck to the adherend in a desired shape.

In order to reliably transfer the threadlike adhesive, that is, in order to prevent the threadlike adhesive from being debonded from the adherend and remaining on the temporary support, the temporary support is preferably debonded from the adherend by peeling, and a peeling angle at this time is preferably 5° or more, more preferably 100 or more, and still more preferably 20° or more. When the temporary support is debonded by peeling, the debonding may be performed with the temporary support deformed, the debonding may be performed with the adherend deformed, or the debonding may be performed with both the temporary support and the adherend deformed. A suitable debonding method may be appropriately selected according to the hardness (deformability) of the temporary support and the adherend.

As described above, the threadlike adhesive 2 is formed (drawn) on the temporary support into a shape obtained by inverting a desired shape and then transferred to stick the threadlike adhesive 2 to the adherend in a desired shape. Accordingly, the threadlike adhesive 2 can be easily stuck to the adherend even when the sticking shape is complicated.

Based on such a feature, the method for sticking the threadlike adhesive by transfer is suitable as, for example, a method for sticking the threadlike adhesive body for fixing a cable such as an electric wire or an optical fiber, a LED fiber light, optical fiber sensors such as fiber Bragg gratings (FBG), various wires (linear members) such as a yarn, a string, or a wire, or a narrow member in a desired form. Even in the case of fixing a wire or a narrow member to another member having a complicated shape, the method for sticking the threadlike adhesive by transfer allows the threadlike adhesive to be easily stuck to a member to which a wire or a narrow member is stuck according to a complicated shape of the wire or the narrow member.

For example, when the threadlike adhesive is used for temporary fixing in the case of sewing fiber products or leather products such as clothes, shoes, bags, or hats, temporarily fixing can be easily performed with avoiding a part to be sewed, and the adhesive can be easily prevented from adhering to the needle. When an article to be sewed has a complicated shape or is easily deformed, the threadlike adhesive may not be easily stuck. However, even in such a case, the threadlike adhesive can be easily stuck by the method for sticking the threadlike adhesive by transfer.

The present invention is not limited to the embodiments described above, and may be appropriately modified, improved, and the like. Materials, shapes, sizes, numerical values, forms, numbers, arrangement positions, and the like of components in the embodiments described above are set as desired and are not limited as long as the present invention can be achieved.

EXAMPLE

Hereinafter, the present invention will be described in more detail with reference to Examples and the like, but the present invention is not limited to the following Examples.

Example (Preparation of Coating Solution)

Into a reaction vessel equipped with a cooling tube, a nitrogen introduction tube, a thermometer, and a stirrer, 40 parts by mass of ion-exchanged water was added, and stirring was performed at 60° C. for 1 hour or more while introducing nitrogen gas to carry out nitrogen substitution. To this reaction vessel, 0.1 parts by mass of 2,2'-azobis[N-(2-carboxyethyl)-2-methylpropionamidine]n hydrate (polymerization initiator) was added. While the system was maintained at 60° C., a monomer emulsion A was gradually added dropwise thereto over 4 hours to allow an emulsion polymerization to proceed.

As the monomer emulsion A, an emulsion obtained by adding 98 parts by mass of 2-ethylhexyl acrylate, 1.25 parts by mass of acrylic acid, 0.75 parts by mass of methacrylic acid, 0.05 parts by mass of lauryl mercaptan (chain transfer agent), 0.02 parts by mass of y-methacryloxypropyltrimethoxysilane (manufactured by Shin-Etsu Chemical Co., Ltd., trade name: "KBM-503"), and 2 parts by mass of sodium polyoxyethylene lauryl sulfate (emulsifier) to 30 parts by mass of ion-exchanged water and then performing emulsification, was used.

After completion of the dropwise addition of the monomer emulsion A, the system was further kept at 60° C. for 3 hours. And, after the system was cooled to room temperature, and pH of the resultant solution was then adjusted to 7 by addition of 10% ammonia water to obtain an acrylic polymer emulsion (water-dispersible acrylic polymer).

A tackifying resin emulsion (manufactured by Arakawa Chemical Industries, Ltd., trade name: "E-865NT") was added, to the system, in an amount of 24 parts by mass in terms of the solid content, per 100 parts by mass of the acrylic polymer contained in the above acrylic polymer emulsion. Further, ion exchange water was added to the system to adjust the solid content concentration to 50 mass % to obtain a coating solution.

(Production of Threadlike Adhesive)

As a core material, a multifilament yarn was prepared by twisting seven polyester fibers having the number of filaments of 336 and a fineness of 1155 dtex 70 times/m.

A viscosity of the coating solution under the condition of a shear rate of 100 (1/s) was 0.4 Pa·s, and a viscosity of the coating solution under the condition of a shear rate of 0.1 (1/s) was 47 Pa·s. The core material was coated by dipping using a coating roller being rotated at the same speed as the feeding speed. At this time, a tension of 1.3 mN/dtex was applied to the core material. Thereafter, the resultant was dried at 100° C. for 4 minutes to obtain a threadlike adhesive body having a diameter (width in a lateral direction) of 0.45 mm.

(Viscosity of Coating Solution)

A viscosity of the coating solution was measured when the shear rate was changed from high speed (viscosity decrease) to low speed (viscosity recovery).

Specifically, 1 g of a sample (coating solution) was placed in a measurement plate (MP35 Steel, 18/8, sensor: Rotor C35/1, Cone with D=35 mm, 1° Titan, gap between plates: 0.225 mm), and the solution viscosity (Pa·s) of the coating liquid was first measured at a shear rate of 0.01 (1/s) for 10 seconds under a condition of 23° C. using a viscosity-viscoelasticity measuring device (rheometer, trade name "RS-600", manufactured by HAAKE). Thereafter, the shear rate was changed to 9000 (1/s) (A) over 20 seconds, and then, the shear rate returned to 0.01 (1/s) (B) over 20 seconds, and the solution viscosity (Pa·s) of the coating solution during this period was measured.

A value of the solution viscosity (Pa·s) of the coating solution at a time point when a shear rate was 100 (1/s) during the period in which the above shear rate was changed to 9000 (1/s) (A) was the solution viscosity (Pa·s) at a shear rate of 100 (1/s). A value of the solution viscosity (Pa·s) of the coating solution at a time point when a shear rate was 0.1 (1/s) during the period in which the shear rate returned to 0.01 (1/s) (B) was the solution viscosity (Pa·s) at a shear rate of 0.1 (1/s).

(Tension of Core Material)

The tension of the core material was measured using a digital force gauge (AD-4932A) during coating. Specifically, the tension between a feeding point of the core material and a coating roll was measured by reading the stress applied to a terminal of the force gauge.

(Evaluation Results when Nozzle Hole Diameter is Changed)

Using the threadlike adhesive having a diameter of 0.45 mm produced as described above, a linear shape/curved shape (R=10 mm, 5 mm, 2 mm, 1 mm) was drawn by changing the sticking speed of the threadlike adhesive to 1, 10, 20, 50, 100, 150, 200 mm/sec when the nozzle hole diameter was set to 1 mm and 2 mm. The experimental results are as follows.

When a linear shape is drawn with the threadlike adhesive, in the case of a nozzle hole diameter of 1 mm, the threadlike adhesive was accurately stuck at each sticking speed excluding 200 mm/sec. When a curved shape is drawn with the threadlike adhesive, in the case of a nozzle hole diameter of 1 mm, the threadlike adhesive was stuck at a sticking speed of 20 mm/sec or less (10 mm/sec or less in the case of R=1 mm).

When a linear shape is drawn with the threadlike adhesive, in the case of a nozzle hole diameter of 2 mm, the threadlike adhesive was accurately stuck at each sticking speed of 20 mm/sec or less. When a curved shape is drawn with the threadlike adhesive, in the case of a nozzle hole diameter of 2 mm, the threadlike adhesive was stuck at a sticking speed of less than 10 mm/sec in the case of R=10 mm.

From the above results, it was found that in the case of the threadlike adhesive having a diameter of 0.45 mm, the nozzle hole diameter is preferably 0.7 mm.

INDUSTRIAL APPLICABILITY

The threadlike adhesive sticking apparatus and the method for sticking a threadlike adhesive of the present invention allows the threadlike adhesive to appropriately exhibit the adhesive force to be accurately stuck to any path. Therefore, the present invention can be applied to bonding work in various fields.

Although preferred embodiments of the present invention have been described above, the present invention is not limited to the above embodiments, and various modifications and substitutions can be added to the above embodiments without departing from the scope of the present invention.

The present application is based on a Japanese patent application (No. 2020-064049) filed on Mar. 31, 2020, contents of which are incorporated herein by reference.

REFERENCE SIGNS LIST

1 Main body
2 Threadlike adhesive
3 Grip
4 Tip end portion
5, 120 Winding body
100, 101, 101A, 101B Threadlike adhesive sticking apparatus
105 Horizontal moving unit
106 Attachment plate
106a Roller attachment unit
106b Nozzle attachment unit
107 Nozzle
107d Tip end
136, 137 Spring
150A to 150E Feeding-out assist mechanism
AU Supply unit
BU Pressing mechanism
CU Conveyance unit
DU Positioning unit

The invention claimed is:

1. A threadlike adhesive sticking apparatus, comprising:
a nozzle having a tip end configured to press a threadlike adhesive against an object;
a nozzle support that is attached to the nozzle and is configured to displace the nozzle by being displaced in a pressing direction;
an assist mechanism comprising a first roller and a second roller configured to sandwich the threadlike adhesive between the first roller and the second roller, wherein the first roller is rotated by a driving force, the second roller is rotated in conjunction with rotation of the first roller, and the first roller and the second roller pull the threadlike adhesive sandwiched between the first roller and the second roller in a rotation direction;
one or more springs that adjust tensile forces of the rollers, wherein the one or more springs are attached to the second roller that is rotated in conjunction with rotation of the first roller that is driven by the driving force, and which is free from being attached to the one or more springs; and
an absorption mechanism comprising at least one of a spring, a damper, or an air cylinder, wherein the absorption mechanism is configured to absorb a displacement of the nozzle with respect to a displacement of the nozzle support in the pressing direction.

2. The threadlike adhesive sticking apparatus according to claim 1, comprising:
a movement control unit configured to control movement of the nozzle support so as to stick the threadlike adhesive to the object along a predetermined path, wherein
the movement control unit is configured to cause the nozzle support to approach the object, at least at any one of a start point of the predetermined path, a start point or an end point of a curve included in the predetermined path, and a vertex of a corner included in the predetermined path.

3. The threadlike adhesive sticking apparatus according to claim 1, wherein
the nozzle comprises an inner wall surface defining a cylindrical internal space and the tip end of the nozzle has a tip end opening allowing the internal space to communicate with the outside at one end of the inner wall surface, the tip end of the nozzle is configured to press the threadlike adhesive allowed to pass through the internal space and is led out to the outside from the tip end opening, against the object, and portions of a peripheral portion surrounding the tip end opening at the tip end of the nozzle are used to press the threadlike adhesive against the object.

4. The threadlike adhesive sticking apparatus according to claim 1, wherein the threadlike adhesive is initially wound around a winding body, and the apparatus is configured to feed out the threadlike adhesive from the winding body to supply the threadlike adhesive to the nozzle, the assist mechanism is configured to apply an external force in a feeding direction to the threadlike adhesive fed out from the winding body, and the tip end of the nozzle is configured to press the fed out threadlike adhesive against the object.

5. A method for sticking a threadlike adhesive, comprising sticking the threadlike adhesive to the object using the threadlike adhesive sticking apparatus according to claim 1.

6. The threadlike adhesive sticking apparatus according to claim 2, wherein the nozzle comprises an inner wall surface defining a cylindrical internal space and the tip end of the nozzle has a tip end opening allowing the internal space to communicate with the outside at one end of the inner wall surface, the tip end of the nozzle is configured to press the threadlike adhesive allowed to pass through the internal space and is led out to the outside from the tip end opening, against the object, and portions of a peripheral portion surrounding the tip end opening at the tip end of the nozzle are used to press the threadlike adhesive against the object.

7. The threadlike adhesive sticking apparatus according to claim 2, wherein the threadlike adhesive is initially wound around a winding body, and the apparatus is configured to feed out the threadlike adhesive from the winding body to supply the threadlike adhesive to the nozzle, the assist mechanism is configured to apply an external force in a feeding direction to the threadlike adhesive fed out from the winding body, and the tip end of the nozzle is configured to press the fed out threadlike adhesive against the object.

8. The threadlike adhesive sticking apparatus according to claim 3, wherein the threadlike adhesive is initially wound around a winding body, and the apparatus is configured to feed out the threadlike adhesive from the winding body to supply the threadlike adhesive to the nozzle, the assist mechanism is configured to apply an external force in a feeding direction to the threadlike adhesive fed out from the winding body, and the tip end of the nozzle is configured to press the fed out threadlike adhesive against the object.

9. The threadlike adhesive sticking apparatus according to claim 6, wherein the threadlike adhesive is initially wound around a winding body, and the apparatus is configured to feed out the threadlike adhesive from the winding body to supply the threadlike adhesive to the nozzle, the assist mechanism is configured to apply an external force in a feeding direction to the threadlike adhesive fed out from the winding body, and the tip end of the nozzle is configured to press the fed out threadlike adhesive against the object.

10. A method for sticking a threadlike adhesive, comprising sticking the threadlike adhesive to the object using the threadlike adhesive sticking apparatus according to claim 2.

11. A method for sticking a threadlike adhesive, comprising sticking the threadlike adhesive to the object using the threadlike adhesive sticking apparatus according to claim 3.

12. A method for sticking a threadlike adhesive, comprising sticking the threadlike adhesive to the object using the threadlike adhesive sticking apparatus according to claim 4.

* * * * *